(12) United States Patent
Hirukawa

(10) Patent No.: US 9,448,493 B2
(45) Date of Patent: *Sep. 20, 2016

(54) EXPOSURE METHOD, EXPOSURE APPARATUS, AND METHOD FOR PRODUCING DEVICE

(71) Applicant: NIKON CORPORATION, Tokyo (JP)

(72) Inventor: Shigeru Hirukawa, Tokyo (JP)

(73) Assignee: NIKON CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/788,940

(22) Filed: Mar. 7, 2013

(65) Prior Publication Data

US 2013/0182232 A1    Jul. 18, 2013

Related U.S. Application Data

(60) Division of application No. 12/222,706, filed on Aug. 14, 2008, now Pat. No. 8,421,992, and a division of application No. 11/287,317, filed on Nov. 28, 2005, now Pat. No. 7,483,117, and a continuation of application No. PCT/JP2004/007569, filed on May 26, 2004.

(30) Foreign Application Priority Data

May 28, 2003 (JP) ................................ 2003-151369

(51) Int. Cl.
G03B 27/52 (2006.01)
G03F 7/20 (2006.01)

(52) U.S. Cl.
CPC ......... *G03F 7/70341* (2013.01); *G03F 7/7085* (2013.01); *G03F 7/70258* (2013.01); *G03F 7/70433* (2013.01); *G03F 7/70858* (2013.01)

(58) Field of Classification Search
CPC .......... G03F 7/70258; G03F 7/70341; G03F 7/70433; G03F 7/7085; G03F 7/70858
USPC ....... 355/30, 52, 53, 55, 72, 77; 430/30, 311
See application file for complete search history.

(56) References Cited

U.S. PATENT DOCUMENTS

| 4,346,164 A | 8/1982 | Tabarelli et al. |
| 4,465,368 A | 8/1984 | Matsuura et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Toan Ton
*Assistant Examiner* — Mona M Sanei
(74) *Attorney, Agent, or Firm* — Oliff PLC

(57) ABSTRACT

An exposure apparatus and method exposes a substrate by projecting an image of a pattern onto the substrate through a liquid. A projection optical system projects the image of the pattern onto the substrate. A recovery port recovers the liquid supplied onto the substrate. A temperature sensor measures a temperature of the liquid recovered via the recovery port.

23 Claims, 15 Drawing Sheets

(56) References Cited

U.S. PATENT DOCUMENTS

| | | | |
|---|---|---|---|
| 4,480,910 A | 11/1984 | Takanashi et al. | |
| 4,503,335 A | 3/1985 | Takahashi | |
| 5,528,118 A | 6/1996 | Lee | |
| 5,610,683 A | 3/1997 | Takahashi | |
| 5,610,965 A * | 3/1997 | Mori et al. | 378/34 |
| 5,623,853 A | 4/1997 | Novak et al. | |
| 5,715,039 A | 2/1998 | Fukada et al. | |
| 5,721,608 A | 2/1998 | Taniguchi | |
| 5,825,043 A | 10/1998 | Suwa | |
| 5,874,820 A | 2/1999 | Lee | |
| 5,969,441 A | 10/1999 | Loopstra et al. | |
| 6,191,429 B1 | 2/2001 | Suwa | |
| 6,203,969 B1 | 3/2001 | Ueda | |
| 6,208,407 B1 | 3/2001 | Loopstra | |
| 6,235,438 B1 * | 5/2001 | Suzuki et al. | 430/30 |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,676,289 B2 | 1/2004 | Hirano et al. | |
| 6,753,948 B2 | 6/2004 | Taniguchi | |
| 6,811,953 B2 | 11/2004 | Hatada et al. | |
| 7,433,015 B2 | 10/2008 | Mulkens et al. | |
| 7,483,117 B2 | 1/2009 | Hirukawa | |
| 8,233,133 B2 | 7/2012 | Hirukawa | |
| 8,421,992 B2 | 4/2013 | Hirukawa | |
| 2002/0005940 A1 | 1/2002 | Hatada et al. | |
| 2002/0027945 A1 | 3/2002 | Hirano et al. | |
| 2002/0163629 A1 | 11/2002 | Switkes et al. | |
| 2003/0007136 A1 * | 1/2003 | Emoto et al. | 355/30 |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0007569 A1 | 1/2005 | Streefkerk et al. | |
| 2005/0007570 A1 | 1/2005 | Streefkerk et al. | |
| 2005/0024609 A1 | 2/2005 | De Smit et al. | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0094119 A1 | 5/2005 | Loopstra et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0179877 A1 | 8/2005 | Mulkens et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259234 A1 | 11/2005 | Hirukawa et al. | |
| 2005/0270505 A1 | 12/2005 | Smith | |
| 2006/0033892 A1 * | 2/2006 | Cadee et al. | 355/30 |
| 2006/0197930 A1 | 9/2006 | Kawashima et al. | |
| 2006/0209280 A1 * | 9/2006 | Makita et al. | 355/53 |
| 2007/0211233 A1 * | 9/2007 | Van De Kerkhof et al. | 355/30 |
| 2010/0007862 A1 * | 1/2010 | Arai | 355/30 |

FOREIGN PATENT DOCUMENTS

| | | |
|---|---|---|
| EP | 0 689 099 A1 | 12/1995 |
| EP | 0 834 773 A1 | 4/1998 |
| EP | 0 834 773 A2 | 8/1998 |
| EP | 1 571 697 A1 | 9/2005 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | H06-168866 A | 6/1994 |
| JP | A-7-220990 | 8/1995 |
| JP | A-H07-283109 | 10/1995 |
| JP | A-08-166475 | 6/1996 |
| JP | A-8-316125 | 11/1996 |
| JP | A-08-330224 | 12/1996 |
| JP | A-10-154659 | 6/1998 |
| JP | A-10-163099 | 6/1998 |
| JP | A-10-214783 | 8/1998 |
| JP | A 10-303114 | 11/1998 |
| JP | A 10-340846 | 12/1998 |
| JP | A-11-176727 | 7/1999 |
| JP | H11-219895 A | 8/1999 |
| JP | A-2000-58436 | 2/2000 |
| JP | A-2000-091183 | 3/2000 |
| JP | A-2000-505958 | 5/2000 |
| JP | A-2001-330964 | 11/2001 |
| JP | A 2001-337463 | 12/2001 |
| JP | A-2002-064050 | 2/2002 |

(56) References Cited

FOREIGN PATENT DOCUMENTS

| | | |
|---|---|---|
| KR | 1998-0032589 | 7/1998 |
| KR | 2002-0014984 | 2/2002 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, $3^{rd}$ 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithography; its potential performance and issues", Soichi Owa et al., pp. 724-733.

Nikon Corporation, NGL Workshop, Jul. 10, 2003, "Potential performance and feasibility of immersion lithography", Soichi Owa et al., 33 pages, slides 1-33.

Sep. 24, 2009 Office Action in U.S. Appl. No. 11/312,478.

Mar. 9, 2010 Office Action for Japanese Patent Application No. 2004-156545 (with translation).

Office Action issued in corresponding Chinese Patent Application No. 2004-80014675.6 on Nov. 9, 2007 (with translation).

Office Action issued in corresponding Chinese Patent Application No. 2004-80014675.6 on Feb. 6, 2009 (with translation).

Office Action issued in corresponding Chinese Patent Application No. 2009-10160494.9 on Sep. 14, 2010 (with translation).

Office Action issued in corresponding Japanese Patent Application No. 2004-156545 on Aug. 10, 2010 (with translation).

Office Action issued in corresponding European Patent Application No. 04734933.7 on Jan. 21, 2010.

Supplementary Search Report issued in corresponding European Patent Application No. 04734933.7 on Aug. 18, 2009.

International Search Report issued in corresponding International Application No. PCT/JP2004/007569 on Sep. 14, 2004 (with translation).

Aug. 8, 2007 Office Action in U.S. Appl. No. 11/287,317.

May 15, 2008 Notice of Allowance in U.S. Appl. No. 11/287,317.

Sep. 18, 2008 Notice of Allowance in U.S. Appl. No. 11/287,317.

Jul. 7, 2010 Office Action in U.S. Appl. No. 11/312,478.

Feb. 16, 2011 Office Action issued in Korean Patent Application No. 2005-7022446 (w/English-language Translation).

Jun. 2, 2011 Office Action issued in Chinese Patent Application No. 200910160494.9 (w/English-language Translation).

Jun. 17, 2011 Office Action issued in U.S. Appl. No. 12/314,823.

Apr. 5, 2011 Notice of Allowance issued in U.S. Appl. No. 11/312,478.

Feb. 8, 2011 Decision of Refusal for Japanese Patent Application No. 2004-156545 (with English translation).

Feb. 8, 2011 Decision to Dismiss the Amendment for Japanese Patent Application No. 2004-156545 (with English translation).

Apr. 18, 2007 Office Action issued in U.S. Appl. No. 11/287,317.

Nov. 18, 2008 Office Action issued in U.S. Appl. No. 11/312,478.

Jul. 26, 2011 Notice of Allowance issued in U.S. Appl. No. 11/312,478.

Nov. 18, 2011 Notice of Allowance issued in U.S. Appl. No. 11/312,478.

Nov. 22, 2011 Office Action issued in Taiwanese Patent Application No. 093115282 (with English translation).

Dec. 8, 2011 Office Action issued in Korean Patent Application No. 2011-7019069 (with English translation).

Feb. 23, 2012 Office Action issued in Chinese Application No. 200910160494.9 (with English translation).

Mar. 26, 2012 Office Action issued in Korean Application No. 2005-7022446 (with English translation).

Aug. 14, 2012 Office Action issued in Korean Application No. 2012-7013925 (with English translation).

Jan. 24, 2012 Notice of Allowance issued in U.S. Appl. No. 12/314,823.

Mar. 19, 2012 Notice of Allowance issued in U.S. Appl. No. 11/312,478.

Oct. 15, 2012 Office Action issued in Korean Patent Application No. 2005-7022446 (with English translation).

Oct. 29, 2012 Office Action issued in Korean Patent Application No. 2011-7019069 (with English translation).

Jun. 23, 2011 Office Action issued in U.S. Appl. No. 12/222,706.

May 11, 2012 Office Action issued in U.S. Appl. No. 12/222,706.

Dec. 11, 2012 Notice of Allowance issued in U.S. Appl. No. 12/222,706.

May 31, 2013 Office Action issued in U.S. Appl. No. 12/314,823.

Oct. 29, 2013 Office Action issued in Japanese Patent Application No. 2012-079576 (with translation).

(56) References Cited

OTHER PUBLICATIONS

Jul. 24, 2012 Office Action issued in Japanese Patent Application No. 2010-108741(with translation).
Jul. 24, 2012 Office Action issued in Japanese Patent Application No. 2010-229937 (with translation).
Oct. 24, 2012 Office Action issued in Japanese Patent Application No. 2010-229937 (with translation).
Oct. 23, 2012 Office Action issued in Japanese Patent Application No. 2010-108741 (with translation).
May 22, 2014 Notice of Reconsideration issued in Chinese Patent Application No. 200910160494.9 (with translation).
Mar. 27, 2014 Office Action issued in Korean Patent Application No. 2013-7003770 (with translation).
Mar. 10, 2014 Office Action issued in Taiwanese Patent Application No. 101118138 (with translation).
Dec. 1, 2005 International Preliminary Report on Patentability issued in Application No. PCT/JP2004/007569 (with translation).
Apr. 28, 2014 Office Action issued in Korean Application No. 2012-7013925.
Nov. 28, 2014 Office Action issued in Korean Application No. 2012-7013925.
Mar. 28, 2014 Office Action issued in Korean Application No. 2013-7003771.
Jan. 8, 2015 Office Action issued in Korean Application No. 2013-7003771.
Jan. 12, 2015 Office Action issued in Korean Application No. 2013-7003770.
Aug. 26, 2014 Office Action issued in Japanese Patent Application No. 2013-269180 (with translation).
May 19, 2015 Office Action issued in Korean Application No. 2013-7003771.
Oct. 29, 2015 Office Action issued in Korean Application No. 10-2012-7013925.
May 26, 2016 Office Action issued in Korean Patent Application No. 2015-7005388.
Jun. 29, 2016 Office Action issued in Korean Patent Application No. 2012-7013925.

* cited by examiner

EXPOSURE METHOD, EXPOSURE APPARATUS, AND METHOD FOR PRODUCING DEVICE

CROSS-REFERENCE

This is a Division of U.S. patent application Ser. No. 12/222,706 filed Aug. 14, 2008 (now U.S. Pat. No. 8,421, 992), which in turn is a Division of U.S. patent application Ser. No. 11/287,317 filed Nov. 28, 2005 (now U.S. Pat. No. 7,483,117), which in turn is a Continuation of International Application No. PCT/JP2004/007569 filed May 26, 2004 claiming the conventional priority of Japanese patent Application No. 2003-151369 filed on May 28, 2003. The disclosure of each of the prior applications is incorporated herein by reference in its entirety.

BACKGROUND OF THE INVENTION

1. Field of the Invention

The present invention relates to an exposure method, an exposure apparatus, and a method for producing a device wherein a substrate is exposed with a pattern in a state in which a liquid immersion area is formed between a projection optical system and the substrate.

2. Description of the Related Art

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

When a temperature distribution arises in the liquid, there has been a possibility to cause the change (for example, the inclination) of the image plane of the image of the pattern to be formed on the substrate through the liquid and the variation or fluctuation of various aberrations including, for example, the distortion and the magnification.

SUMMARY OF THE INVENTION

The present invention has been made taking the foregoing circumstances into consideration, an object of which is to provide an exposure method, an exposure apparatus, and a method for producing a device wherein a pattern can be accurately transferred when a substrate is subjected to the liquid immersion exposure through a liquid disposed between a projection optical system and the substrate.

In order to achieve the object as described above, the present invention adopts the following constructions.

According to a first aspect of the present invention, there is provided an exposure method for exposing a substrate by projecting an image of a pattern on a mask onto the substrate through a liquid disposed between a projection optical system and the substrate, the exposure method comprising:

adjusting a projection state of the image of the pattern depending on a distribution of an exposure light beam which comes into the liquid; and exposing the substrate in the adjusted projection state.

According to the present invention, even when any temperature distribution appears in the liquid as a result of the occurrence of any distribution in the exposure light beam which comes into the liquid disposed between the projection optical system and the substrate, the exposure condition, for example, the projection state of the image of the pattern is adjusted depending on the distribution of the exposure light beam. Accordingly, the pattern can be transferred onto the substrate in a desired state. In this specification, the phrase "adjustment of the projection state of the image of the pattern" refers to not only the adjustment of the position of the image plane of the image of the pattern but also the adjustment of the state of the image of the pattern represented by the image formation characteristic such as the magnification and/or the distortion of the image of the pattern. The adjustment includes various types of adjustment in order to adjust the projection state of the image of the pattern. The adjustment includes not only the adjustment of the positional relationship between the image plane of the image of the pattern and the exposure surface of the substrate and/or the adjustment of the projection optical system, but also the adjustment of the wavelength of the exposure light beam, the adjustment (for example, the positional adjustment and the temperature adjustment) and/or the exchange of the optical member disposed in the optical path for the exposure light beam, the adjustment of the position of the mask, and the adjustment or regulation of the atmosphere of the optical path arriving at the substrate, including, for example, the temperature, the pressure, and the gas concentration. Therefore, the adjustment also includes the change or the regulation of the temperature, the flow rate, and the component of the liquid to be supplied to the space between the substrate and the projection optical system.

According to a second aspect of the present invention, there is provided an exposure method for exposing a substrate by projecting an image of a pattern on a mask onto the substrate through a liquid disposed between a projection optical system and the substrate, the exposure method comprising:

adjusting a projection state of the image of the pattern depending on a distribution of the pattern on the mask; and exposing the substrate in the adjusted projection state.

According to the present invention, even when any distribution arises in the exposure light beam which comes into the liquid disposed between the projection optical system and the substrate depending on the distribution of the pattern on the mask, and any temperature distribution arises in the liquid thereby, then the pattern can be transferred onto the substrate in a desired state, for example, by adjusting the projection state of the image of the pattern depending on the distribution of the pattern on the mask.

According to a third aspect of the present invention, there is provided an exposure method for exposing a substrate by projecting an image of a pattern on a mask onto the substrate through a liquid disposed between a projection optical system and the substrate, the exposure method comprising:

measuring information about a distribution of an exposure light beam which comes into the liquid via the projection optical system prior to the exposure; and exposing the substrate while adjusting a projection state of the image of the pattern on the basis of the information about the measured distribution.

According to the present invention, the information about the distribution of the exposure light beam which comes into the liquid is previously measured to perform, for example, the adjustment of the projection state of the image of the pattern during the exposure on the basis of the result of the measurement. Accordingly, even when any distribution arises in the exposure light beam which comes into the liquid, and the temperature of the liquid is partially changed, then the pattern can be transferred onto the substrate in a desired state while accurately adjusting the projection state of the image of the pattern.

According to a fourth aspect of the present invention, there is provided an exposure method for exposing a substrate by projecting an image of a pattern onto the substrate by using a projection optical system while moving the substrate in a predetermined direction, the exposure method comprising:

measuring a temperature distribution of the liquid in a direction intersecting the predetermined direction;

adjusting a projection state of the image of the pattern on the basis of information about the measured temperature distribution; and exposing the substrate in the projection state of the image of the pattern.

According to the present invention, when the liquid immersion exposure is performed while moving the substrate, then the temperature distribution of the liquid is measured in the direction intersecting the direction of movement of the substrate, and the projection state of the image of the pattern is, for example, adjusted during the exposure on the basis of the result of the measurement. Accordingly, even when the temperature of the liquid is partially changed, then the projection state of the image of the pattern can be accurately adjusted, and the image of the pattern can be transferred onto the substrate in a desired state.

According to a fifth aspect of the present invention, there is provided an exposure method for exposing a substrate by projecting an image of a pattern on a mask onto the substrate through a liquid disposed between a projection optical system and the substrate, the exposure method comprising:

measuring a temperature distribution of the liquid by using a temperature sensor arranged on a substrate stage which is movable while holding the substrate; and exposing the substrate on the substrate stage.

According to the present invention, the temperature distribution of the liquid which forms the liquid immersion area is directly measured by using the temperature sensor arranged on the substrate stage. Accordingly, the information about the temperature distribution of the liquid can be accurately determined. For example, the projection state of the image of the pattern can be appropriately adjusted on the basis of the information about the measured temperature distribution of the liquid. The pattern can be transferred onto the substrate in a desired state.

As described above, the adjustment includes the adjustment of the image formation characteristic of the projection optical system (adjustment of the optical characteristic), the adjustment of the positional relationship between the substrate and the image plane formed via the projection optical system and the liquid, and the adjustment of the temperature of the liquid for forming the liquid immersion area (adjustment of the temperature distribution).

According to a sixth aspect of the present invention, there is provided an exposure method for exposing a substrate by projecting an image of a pattern onto the substrate through a liquid, the exposure method comprising:

setting an exposure condition depending on a temperature distribution of the liquid on the substrate onto which the image of the pattern is projected; and exposing the substrate under the set exposure condition.

According to a seventh aspect of the present invention, there is provided an exposure apparatus which exposes a substrate by projecting an image of a predetermined pattern onto the substrate through a liquid, the exposure apparatus comprising:

a projection optical system which projects the image of the pattern onto the substrate; and a temperature sensor which is arranged movably in the vicinity of an image plane of the projection optical system and which measures a temperature of the liquid.

According to the present invention, the movable temperature sensor can be used to directly measure the temperature and/or the temperature distribution of the liquid for forming the liquid immersion area. Therefore, for example, the projection state of the image of the pattern can be appropriately adjusted on the basis of the information about the measured liquid temperature. The pattern can be transferred onto the substrate in a desired state.

According to an eighth aspect of the present invention, there is provided an exposure apparatus which exposes a substrate by projecting an image of a predetermined pattern onto the substrate through a liquid, the exposure apparatus comprising:

a projection optical system which projects the image of the pattern onto the substrate;

a substrate stage which moves the substrate in a predetermined direction during the exposure; and a temperature sensor which has a plurality of sensor elements arranged while being separated from each other in a direction perpendicular to the predetermined direction to measure a temperature of the liquid.

According to the present invention, the temperature distribution of the liquid in the direction intersecting the direction of movement of the substrate can be directly measured by using the plurality of sensor elements. Therefore, it is possible to accurately execute, for example, the adjustment of the projection state of the image of the pattern during the exposure on the basis of the information about the measured temperature of the liquid.

According to a ninth aspect of the present invention, there is provided an exposure apparatus which exposes a substrate by projecting an image of a predetermined pattern onto the substrate through a liquid, the exposure apparatus comprising:

a projection optical system which projects the image of the pattern onto the substrate; and a liquid supply mechanism which is capable of supplying liquids having mutually different temperatures from a plurality of positions respectively to form a liquid immersion area between the substrate and the projection optical system.

According to the present invention, the liquid supply mechanism supplies the liquids having the mutually different temperatures from the plurality of positions respectively. Accordingly, the temperature distribution of the liquid in the liquid immersion area can be adjusted to be uniform. Therefore, it is possible to suppress of the occurrence of the pattern deterioration which would be otherwise caused by any partial change of the temperature of the liquid.

According to a tenth aspect of the present invention, there is provided an exposure apparatus which exposes a substrate by projecting an image of a pattern onto the substrate through a liquid, the exposure apparatus comprising:

a projection optical system which projects the image of the pattern onto the substrate;

a sensor which measures a distribution of the pattern; and a control unit which adjusts a projection state of the image of the pattern on the basis of the distribution of the pattern measured by the sensor.

According to an eleventh aspect of the present invention, there is provided an exposure apparatus which exposes a substrate by projecting an image of a pattern onto the substrate through a liquid, the exposure apparatus comprising:

a projection optical system which projects the image of the pattern onto the substrate;

a liquid recovery mechanism which recovers the liquid from the substrate; and a temperature sensor which measures a temperature of the liquid recovered by the liquid recovery mechanism.

According to a twelfth aspect of the present invention, there is provided a method for producing a device, comprising using the exposure method as defined above. According to a thirteenth aspect of the present invention, there is provided a method for producing a device, comprising using the exposure apparatus as defined above. According to the present invention, it is possible to provide the device which has the pattern transferred at a satisfactory pattern transfer accuracy and which is capable of exhibiting desired performance.

DESCRIPTION OF THE PREFERRED EMBODIMENTS OF THE INVENTION

An explanation will be made below about embodiments of the exposure apparatus according to the present invention with reference to the drawings. However, the present invention is not limited to the embodiments.

First Embodiment

Figure 1:
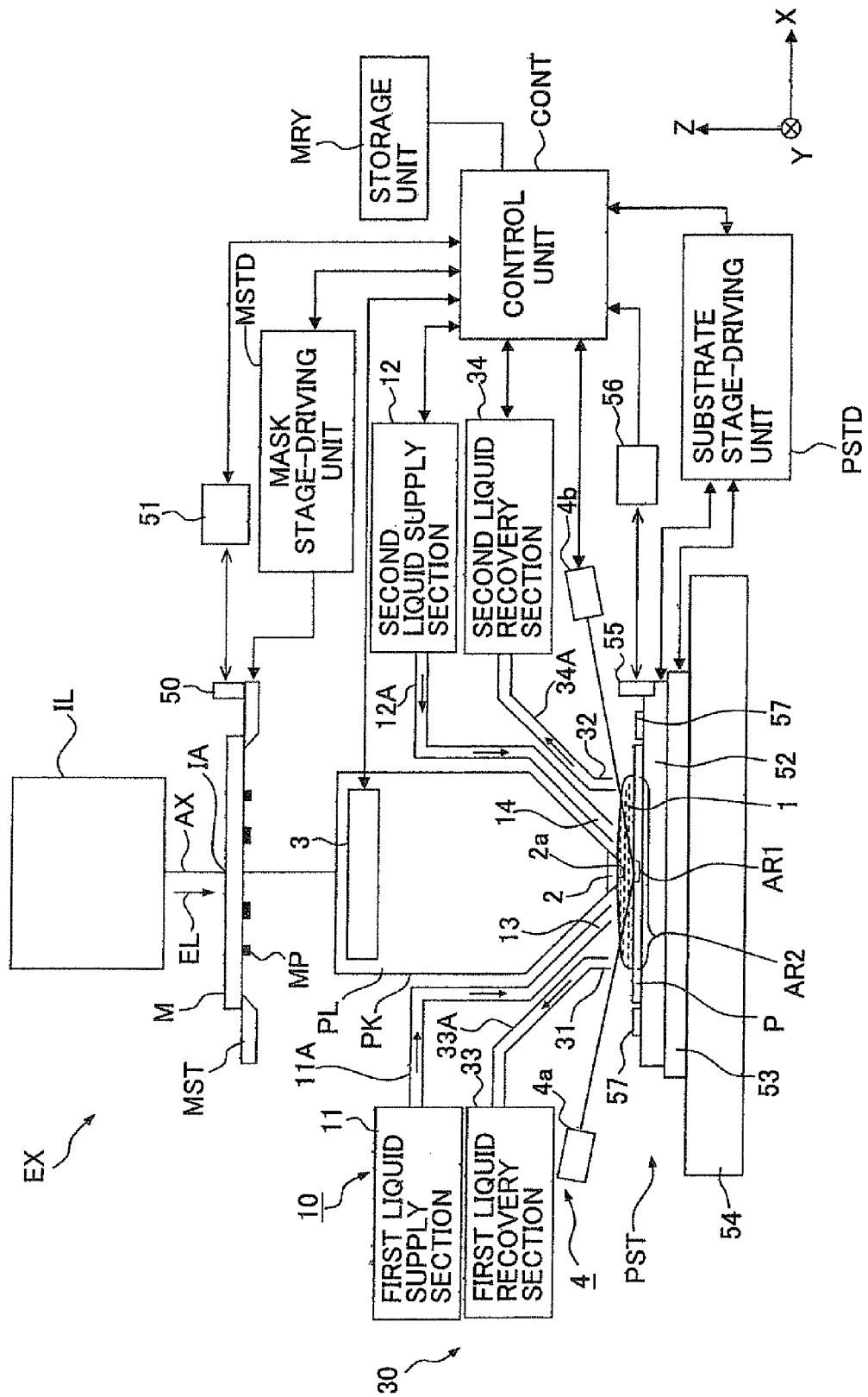
FIG. 1 shows a schematic arrangement illustrating a first embodiment of an exposure apparatus of the present invention.

FIG. 1 shows a schematic arrangement illustrating a first embodiment of the exposure apparatus of the present invention. With reference to FIG. 1, an exposure apparatus EX principally includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, a control unit CONT which collectively controls the overall operation of the exposure apparatus EX, and a storage unit MRY which is connected to the control unit CONT and which stores various pieces of information about the exposure operation including information about the distribution of the pattern MP of the mask M.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism 30 which recovers the liquid 1 from the surface of the substrate P. In this embodiment, pure water is used for the liquid 1. The exposure apparatus EX forms a liquid immersion area AR2 on at least a part of the substrate P including a projection area AR1 of the projection optical system PL by the liquid 1 supplied from the liquid supply mechanism 10 at least during the period in which the image of the pattern of the mask M is transferred onto the substrate P. Specifically, the exposure apparatus EX is operated as follows. That is, the space between the surface (exposure surface) of the substrate P and an optical element 2 disposed at the end portion of the projection optical system PL is filled with the liquid 1. The pattern image of the mask M is projected onto the substrate P to expose the substrate P therewith via the projection optical system PL and the liquid 1 disposed between the projection optical system PL and the substrate P.

The embodiment of the present invention will now be explained as exemplified by a case of the use of the scanning type exposure apparatus (so-called scanning stepper) as the exposure apparatus EX in which the substrate P is exposed with the pattern MP formed on the mask M while synchronously moving the mask M and the substrate P in mutually different directions (opposite directions) in the scanning directions (predetermined direction). In the following explanation, the X axis direction is the synchronous movement direction (scanning direction, predetermined direction) for the mask M and the substrate P in the horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions about the X axis, the Y axis, and the Z axis are designated as θX, θY, and θZ directions respectively. The term "substrate" referred to herein includes those obtained by coating a semiconductor wafer surface with a photosensitive material such as a resist, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area (radiation area) IA on the mask M illuminated with the exposure light beam EL to be slit-shaped. The predetermined illumination area IA on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, pure water is used for the liquid 1 in this embodiment. Therefore, the exposure light beam EL is transmissive therethrough even when the exposure light beam EL is the ArF excimer laser beam. The emission line (g-ray, h-ray, i-ray) in the ultraviolet region and the far ultraviolet light beam (DUV light beam) such as the KrF excimer laser beam (wavelength: 248 nm) are also transmissive through pure water.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification β to perform the exposure. The projection optical system PL includes a plurality of optical elements including the optical element (lens) 2 provided at the end portion on the side of the substrate P. The optical elements for constructing the projection optical system PL are supported by a barrel PK. The projection optical system PL is provided with an image formation characteristic control unit 3 which is capable of adjusting the image formation characteristic (optical characteristic) of the projection optical system PL. The image formation characteristic control unit 3 is constructed to include an optical element-driving mechanism which is capable of moving a part of a plurality of optical elements for constructing the projection optical system PL. A specified optical element, which is included in the plurality of optical elements for constructing the projection optical system PL, can be moved in the direction of the optical axis AX (Z direction) and/or inclined with respect to the optical axis AX by the optical element-driving mechanism. The pressure of the space between the optical elements can be varied by the image formation characteristic control unit 3. When the image formation characteristic control unit 3 is controlled by using the control unit CONT, it is possible to adjust the projection state including various aberrations such as the projection magnification of the projection optical system PL and the distortion, and the image plane position.

In this embodiment, the projection optical system PL is based on the reduction system having the projection magnification β which is, for example, ¼ or ⅕. The projection optical system PL may be based on any one of the 1× magnification system and the magnifying system. The optical element 2, which is disposed at the end portion of the projection optical system PL of this embodiment, is provided detachably (exchangeably) with respect to the barrel PK. The optical element 2, which is disposed at the end portion, is exposed from the barrel PK. The liquid 1 in the liquid immersion area AR2 makes contact with only the optical element 2. Accordingly, the barrel PK formed of metal can be prevented from any corrosion or the like.

The optical element 2 is formed of fluorite. Fluorite has a high affinity for water. Therefore, the liquid 1 is successfully allowed to make tight contact with the substantially entire surface of a liquid contact surface 2a of the optical element 2. That is, in this embodiment, the liquid (pure water) 1, which has the high affinity for the liquid contact surface 2a of the optical element 2, is supplied. Quartz having a high affinity for water may be used as the optical element 2 as well. A water-attracting (lyophilic or liquid-attracting) treatment may be applied to the liquid contact surface 2a of the optical element 2 to further enhance the affinity for the liquid 1.

The exposure apparatus EX further includes a focus-detecting system 4. The focus-detecting system 4 has a light-emitting section 4a and a light-receiving section 4b. The detecting light beam is projected obliquely from an upper position onto the surface (exposure surface) of the substrate P via the liquid 1 from the light-emitting section 4a. The reflected light beam therefrom is received by the light-receiving section 4b. The control unit CONT controls the operation of the focus-detecting system 4. Further, the position (focus position) in the Z axis direction of the surface of the substrate P with respect to a predetermined reference surface is detected on the basis of a light-receiving (detection) result obtained by the light-receiving section 4b. Respective focus positions at a plurality of respective points on the surface of the substrate P are determined, and thus the focus-detecting system 4 also makes it possible to detect the posture of the substrate P in an inclined direction.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. It goes without saying that the Z stage and the XY stage may be provided as an integrated body. When the XY stage 53 of the substrate stage PST is driven, the substrate P is subjected to the control of the position in the XY directions (position in the direction substantially parallel to the image plane of the projection optical system PL).

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the XY stage 53 by the aid of the substrate stage-driving unit PSTD on the basis of the result of the measurement of the laser interferometer 56 to thereby position the substrate P supported on the substrate stage PST in the X axis direction and the Y axis direction.

The control unit CONT drives the Z stage 52 of the substrate stage PST by the aid of the substrate stage-driving unit PSTD. Accordingly, the control unit CONT controls the position (focus position) in the Z axis direction of the substrate P held by the Z stage 52 and the position in the θX direction and the θY direction. That is, the Z stage 52 is operated on the basis of the instruction from the control unit CONT based on the result of the detection performed by the focus-detecting system 4. The focus position (Z position) and the angle of inclination of the substrate P are controlled so that the surface (exposure surface) of the substrate P is allowed to coincide with the image plane formed via the projection optical system PL and the liquid 1.

An auxiliary plate 57 having a flat surface is provided on the substrate stage PST (Z stage 52) so that the substrate P is surrounded thereby. The auxiliary plate 57 is installed so that the surface has approximately the same height as that of the surface of the substrate P held by the substrate holder. In this arrangement, a gap of about 1 to 2 mm is provided between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

The liquid supply mechanism 10 supplies the predetermined liquid 1 onto the substrate P. The liquid supply mechanism 10 principally includes a first liquid supply section 11 and a second liquid supply section 12 which are capable of feeding the liquid 1, a first supply member 13 which is connected to the first liquid supply section 11 via a supply tube 11A and which has a supply port for supplying, onto the substrate P, the liquid 1 fed (discharged) from the first liquid supply section 11, and a second supply member 14 which is connected to the second liquid supply section 12 via a supply tube 12A and which has a supply port for supplying, onto the substrate P, the liquid 1 fed (discharged) from the second liquid supply section 12. The first and second supply members 13, 14 are arranged closely to the surface of the substrate P, and they are provided at mutually different positions in the surface direction of the substrate P. Specifically, the first supply member 13 of the liquid supply mechanism 10 is provided on one side (−X side) in the scanning direction with respect to the projection area AR1, and the second supply member 14 is provided on the other side (+X side) in the scanning direction so that the second supply member 14 is opposed to the first supply member 13.

Each of the first and second liquid supply sections 11, 12 includes, for example, a tank for accommodating the liquid 1, and a pressurizing pump. The first and second liquid supply sections 11, 12 supply the liquid 1 onto the substrate P via the supply tubes 11A, 12A and the supply members 13, 14 respectively. The operation of the first and second liquid supply sections 11, 12 for supplying the liquid is controlled by the control unit CONT. The control unit CONT is capable of controlling the liquid supply amounts per unit time to be supplied onto the substrate P from the first and second liquid supply sections 11, 12 independently respectively. Each of the first and second liquid supply sections 11, 12 includes a temperature-adjusting mechanism for the liquid. The liquid 1, which is adjusted to have approximately the same temperature of 23° C. as the temperature in the chamber for accommodating the apparatus therein, can be stably supplied onto the substrate P.

The liquid recovery mechanism 30 recovers the liquid 1 from the surface of the substrate P. The liquid recovery mechanism 30 includes first and second recovery members 31, 32 each of which has a recovery port arranged closely to the surface of the substrate P, and first and second liquid recovery sections 33, 34 which are connected to the first and second recovery members 31, 32 via recovery tubes 33A, 34A respectively. Each of the first and second liquid recovery sections 33, 34 includes, for example, a sucking unit such as a vacuum pump, and a tank for accommodating the recovered liquid 1. The first and second liquid recovery sections 33, 34 recover the liquid 1 from the surface of the substrate P via the first and second recovery members 31, 32 and the recovery tubes 33A, 34A. The operation of each of the first and second liquid recovery sections 33, 34 for recovering the liquid is controlled by the control unit CONT. The control unit CONT is capable of controlling the liquid recovery amounts per unit time to be recovered by the first and second liquid recovery sections 33, 34 independently respectively.

Figure 2:
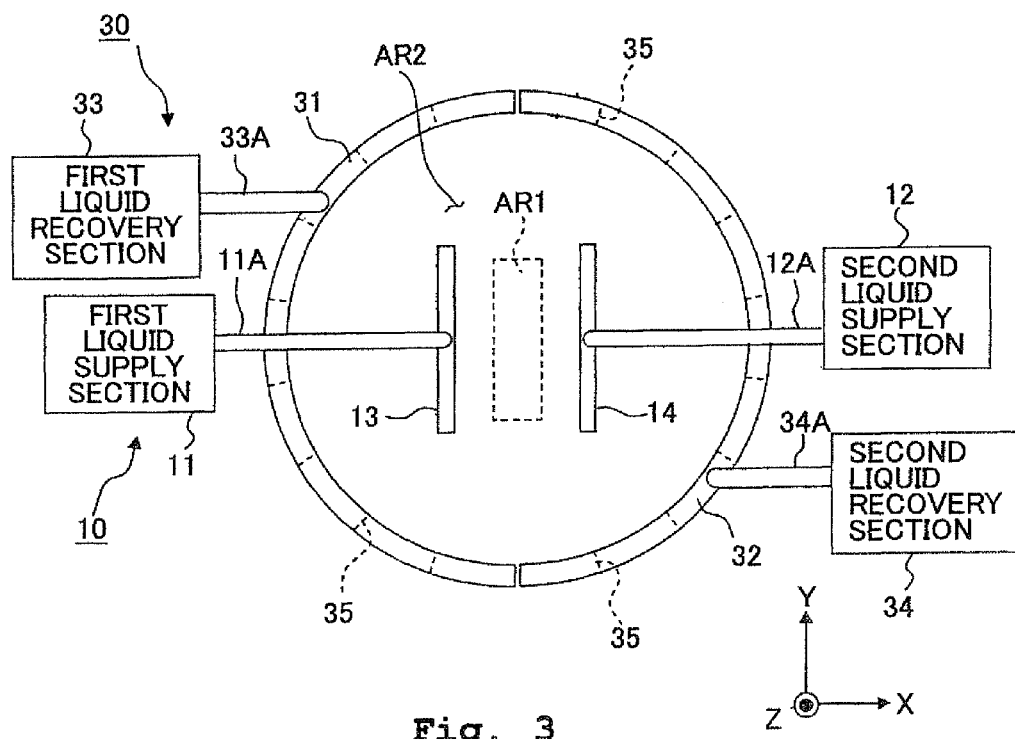
FIG. 2 shows a plan view illustrating a schematic arrangement of a liquid supply mechanism and a liquid recovery mechanism for constructing a part of the exposure apparatus of the present invention.

FIG. 2 shows a plan view illustrating a schematic arrangement of the liquid supply mechanism 10 and the liquid recovery mechanism 30. As shown in FIG. 2, the projection area AR1 of the projection optical system (PL) is designed to have a slit shape (rectangular shape) in which the Y axis direction (non-scanning direction) is the longitudinal direction. The liquid immersion area AR2, which is filled with the liquid 1, is formed on a part of the substrate P so that the projection area AR1 is surrounded thereby. As described above, the first supply member 13 of the liquid supply mechanism 10, which is used to form the liquid immersion area AR2, is provided on one side (−X side) in the scanning direction with respect to the projection area AR1, and the second supply member 14 is provided on the other side (+X side) in the scanning direction on the opposite side. The first and second supply members 13, 14 are formed to be linear as viewed in a plan view in which the Y axis direction is the longitudinal direction respectively. The supply ports of the first and second supply members 13, 14 are formed to be slit-shaped while the Y axis direction is the longitudinal direction respectively, and they are directed to the surface of the substrate P. The liquid supply mechanism 10 simultaneously supplies the liquid 1 from the both sides in the X direction of the projection area AR1 from the supply ports of the first and second supply members 13, 14. As described above, the liquid supply mechanism 10 of this embodiment is capable of supplying the liquid 1 onto the substrate (P) from a plurality of positions in a plurality of directions which are different from each other with respect to the projection area AR1.

Each of the first and second recovery members 31, 32 of the liquid recovery mechanism 30 has a recovery port which is formed continuously to be circular arc-shaped so that the recovery port is directed to the surface of the substrate P. A substantially annular recovery port is formed by the first and second recovery members 31, 32 which are arranged so that they are opposed to one another. The respective recovery ports of the first and second recovery members 31, 32 are arranged to surround the projection area AR1 and the first and second supply members 13, 14 of the liquid supply mechanism 10. A plurality of partition members 35 are provided in the recovery port of each of the first and second recovery members 31, 32.

The liquid 1, which is supplied onto the substrate (P) from the supply ports of the first and second supply members 13, 14, is supplied so that the liquid 1 is spread while causing the wetting between the substrate (P) and the lower end surface of the end portion (optical element 2) of the projection optical system (PL). The liquid 1, which outflows to the outside of the projection area AR1 and the first and second supply members 13, 14, is recovered from the recovery ports of the first and second recovery members 31, 32 arranged outside the first and second supply members 13, 14.

Figure 3:
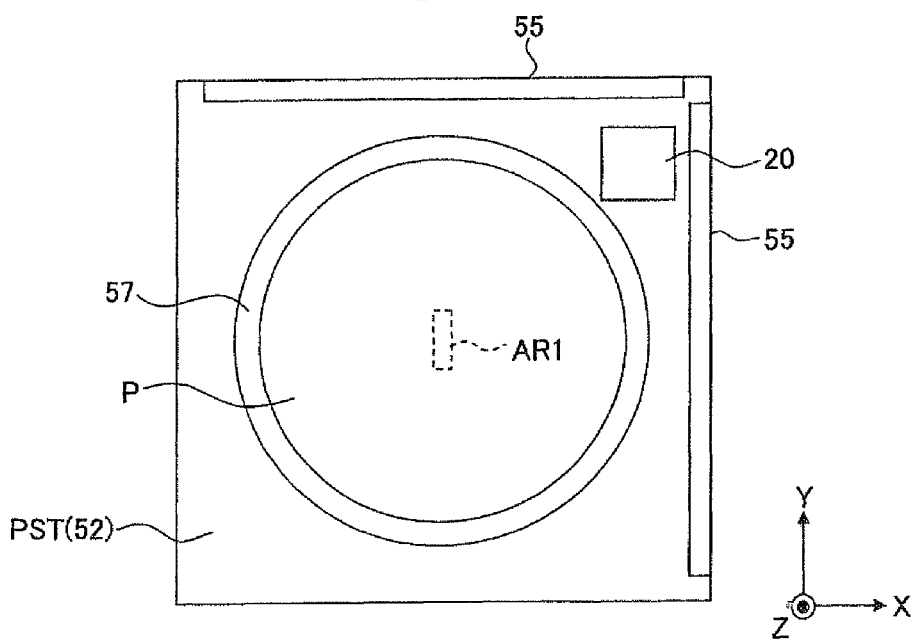
FIG. 3 shows a plan view illustrating a substrate stage for constructing a part of the exposure apparatus of the present invention.

FIG. 3 shows a plan view illustrating the substrate stage PST. An optical sensor 20 as a photoelectric sensor is arranged at a predetermined position on the upper surface of the substrate stage PST (Z stage 52). In an exemplary embodiment shown in FIG. 3, the optical sensor 20 is provided at the position other than the position of the substrate holder for holding the substrate P on the Z stage 52. The optical sensor 20 detects the optical information about the radiated light beam. Specifically, the optical sensor 20 detects the light amount (illuminance) of the radiated light beam. The detection signal of the optical sensor 20 is outputted to the control unit CONT. The control unit CONT determines the illuminance and the illuminance distribution of the radiated light beam on the basis of the result of the detection performed by the optical sensor 20. When the optical sensor 20 is arranged under the projection optical system PL by moving the substrate stage PST, it is possible to detect the illuminance distribution of the exposure light beam EL allowed to pass through the projection optical system PL.

The light-receiving surface (detection area) of the optical sensor 20 has a size which is set to be equal to or larger than that of the projection area AR1. Accordingly, the optical sensor 20 can receive all of the exposure light beam EL which passes through the mask M and which passes through the projection optical system PL. The optical sensor 20 is provided so that the position of the light-receiving surface thereof in the Z axis direction is coincident with the position in the Z axis direction of the image plane (image formation plane) of the projection optical system PL. The optical sensor 20 has a plurality of light-receiving surfaces which are arranged in the non-scanning direction (Y axis direction). The plurality of light-receiving surfaces can be used to measure the illuminance independently respectively. Therefore, the output values of the illuminances measured by the plurality of light-receiving surfaces express the illuminance distribution of the exposure light beam EL in the non-scanning direction as they are.

The substrate stage PST is moved to effect the positional adjustment between the optical sensor 20 and the projection area AR1 of the projection optical system PL. Further, as shown in FIG. 1, the mask M is placed on the mask stage MST, and the mask M is illuminated with the predetermined illumination area IA by using the exposure light beam EL. Accordingly, the optical sensor 20 is irradiated with the exposure light beam EL allowed to pass through the mask M and the projection optical system PL. The mask M has a chromium pattern MP which serves as a light-shielding section. Therefore, the exposure light beam EL is radiated onto the optical sensor 20 in accordance with the illuminance distribution corresponding to the pattern MP of the mask M.

As described above, the optical sensor 20 detects the illuminance distribution in the Y axis direction of the exposure light beam EL to be radiated. The control unit CONT determines the information about the pattern distribution of the mask M in the Y axis direction in the illumination area IA on the basis of the detection result obtained by the optical sensor 20.

Figure 4:
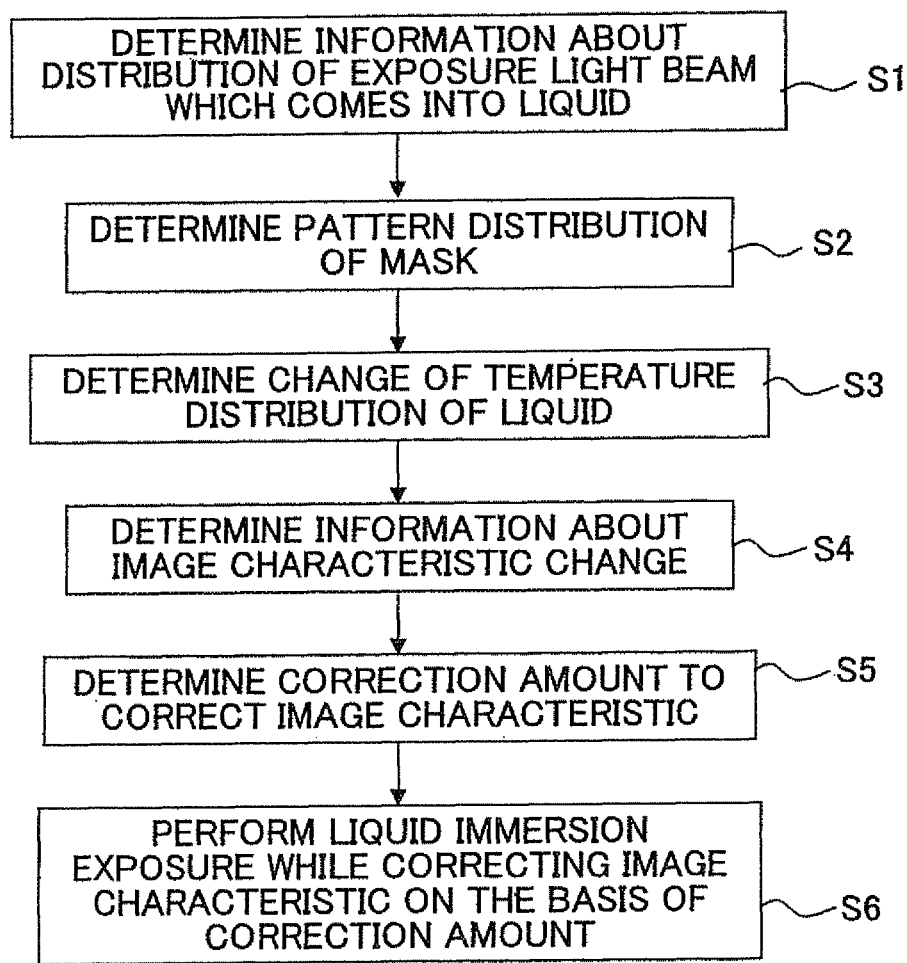
FIG. 4 shows a flow chart illustrating an embodiment of an exposure method of the present invention.

Next, an explanation will be made with reference to a flow chart shown in FIG. 4 about a method for exposing the substrate P with the pattern image of the mask M by using the exposure apparatus EX as described above. In this procedure, the exposure apparatus EX of this embodiment projects the pattern image of the mask M onto the substrate P to perform the exposure while moving the mask M and the substrate P in the X axis direction (scanning direction).

During the scanning exposure, the pattern image of a part of the mask M corresponding to the illumination area IA is projected onto the slit-shaped (rectangular) projection area AR1 disposed just under the end portion of the projection optical system PL. In this procedure, the mask M is moved at the velocity V in the −X direction (or in the +X direction) with respect to the projection optical system PL, in synchronization with which the substrate P is moved at the velocity β·V (β represents the projection magnification) in the +X direction (or in the −X direction) by the aid of the XY stage 53. A plurality of shot areas (SA) are established on the substrate P. The substrate P is subjected to the stepping movement after the completion of the exposure for one shot area (SA), and the next shot area (SA) on the substrate is moved to the scanning start position. After that, the scanning exposure process is successively performed for the respective shot areas SA while moving the substrate P in accordance with the step-and-scan manner.

The illuminance distribution of the exposure light beam EL is measured as follows in a state in which the mask M is not placed on the mask stage MST prior to the liquid immersion exposure process for producing the device. The control unit CONT allows the illumination optical system IL to radiate the exposure light beam EL, and the control unit CONT controls the illumination optical system IL and the substrate stage PST so that the exposure light beam EL, which has passed through the projection optical system PL, is received by the optical sensor 20 disposed on the substrate stage PST. In this way, the illuminance distribution of the exposure light beam EL is measured on the substrate stage PST (on the side of the image plane of the projection optical system PL). Accordingly, the illuminance (reference illuminance) of the exposure light beam EL is determined on the side of the image plane of the projection optical system PL without passing through the mask M. The measured reference illuminance is stored in the storage unit MRY.

Figure 5:
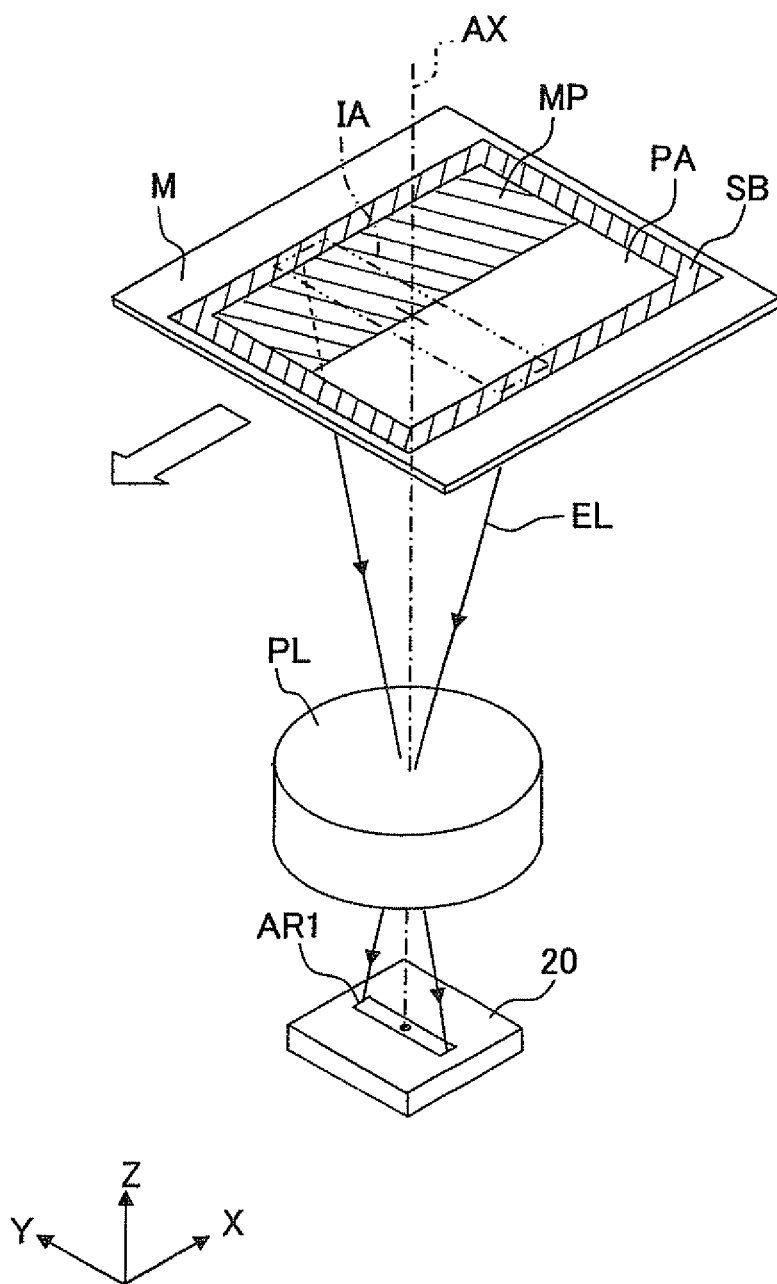
FIG. 5 schematically illustrates a state in which the pattern distribution of a mask is measured.

Subsequently, the mask M is loaded on the mask stage MST. The control unit CONT determines the illuminance distribution of the exposure light beam EL allowed to pass through the mask M and the projection optical system PL, on the side of the image plane of the projection optical system PL by using the optical sensor 20 in a state in which the mask M is placed on the mask stage MST. FIG. 5 schematically shows a state in which the illuminance distribution of the exposure light beam EL allowed to pass through the mask M and the projection optical system PL is measured by using the optical sensor 20. As shown in FIG. 5, the control unit CONT moves the substrate stage PST to perform the positional adjustment between the optical sensor 20 and the projection area AR1 of the projection optical system PL. The exposure light beam EL is radiated from the illumination optical system IL in this state. Accordingly, the exposure light beam EL, which has passed through the mask M and the projection optical system PL, is radiated onto the optical sensor 20. In FIG. 5, the density of the chromium pattern (light-shielding section) MP is high in an approximately half area on the +Y side in the pattern area PA on the mask M. Such a density distribution is provided at any position in the X direction in the pattern area PA. In this situation, the illumination area (radiation area) IA of the exposure light beam EL on the mask M is set to have a slit shape extending in the Y axis direction in the pattern area PA on the mask M. The both ends thereof in the Y axis direction are positioned on the light-shielding band SB. The partial pattern, which is included in the illumination area IA on the mask M, is projected onto the projection area AR1 of the projection optical system PL. The optical sensor 20 receives the exposure light beam EL depending on the pattern distribution in the illumination area IA. The control unit CONT determines the illuminance distribution in the Y axis direction, i.e., the incident energy distribution in the Y axis direction of the exposure light beam EL coming into the liquid 1 for forming the liquid immersion area AR2 during the liquid immersion exposure, on the basis of the result of the detection performed by the optical sensor 20.

Further, the control unit CONT controls the illumination optical system IL and the substrate stage PST and moves the mask stage MST for supporting the mask M in the X axis direction with respect to the exposure light beam EL while radiating the exposure light beam EL onto the illumination area IA on the mask M. Accordingly, the exposure light beam EL is successively radiated onto the entire surface of the pattern area PA of the mask M. In this situation, the optical sensor 20 (substrate stage PST) is not moved. The position of the mask M (mask stage MST) is measured by the laser interferometer 51. The control unit CONT determines the illuminance distribution of the exposure light beam EL at the respective positions in the scanning direction (X direction) of the mask M on the basis of the result of the measurement of the position of the mask M in the X axis direction measured by the laser interferometer 51 and the result of the detection performed by the optical sensor 20 for the exposure light beam EL allowed to pass through the illumination area IA of the mask M in this situation. Accordingly, the control unit CONT determines the information about the illuminance distribution of the exposure light beam EL allowed to pass through the projection optical system PL (Step S1).

Subsequently, the control unit CONT determines the pattern distribution (density distribution of the pattern) of the mask M on the basis of the illuminance information (reference illuminance) of the exposure light beam EL detected without passing through the mask M and the illuminance information of the exposure light beam EL detected via the mask M (Step S2). The illuminance distribution of the exposure light beam EL allowed to pass through the mask M and the projection optical system PL corresponds to the pattern distribution of the mask M. Therefore, the control unit CONT can determine the pattern distribution of the mask M by subtracting the amount corresponding to the illuminance distribution of the reference illuminance from the illuminance distribution of the exposure light beam EL detected via the mask M. The information about the determined pattern distribution of the mask M is stored in the storage unit MRY.

Subsequently, the control unit CONT estimates (calculates) the information about the temperature change of the liquid 1 in the liquid immersion area AR2 during the liquid immersion exposure on the basis of the exposure amount (illuminance on the substrate P) to be set during the liquid immersion exposure in order to produce the device, the information about the determined pattern distribution of the mask M, and the liquid immersion exposure condition. Specifically, the control unit CONT determines the change of the temperature distribution of the liquid in the liquid immersion area AR2 (Step S3). In this procedure, the liquid immersion exposure condition (parameter) includes the movement velocity of the substrate P, the material characteristic such as the specific heat of the liquid 1, and the liquid supply amount (flow rate) per unit time to be supplied from the liquid supply mechanism 10. The relationship between the liquid temperature change amount (distribution) and the pattern distribution of the mask M corresponding to the parameter is previously stored in the storage unit MRY. The control unit CONT estimates (calculates) the liquid temperature distribution on the basis of the stored relationship. The relationship can be previously determined, for example, by means of an experiment or simulation. In the following explanation, the liquid temperature change amount and the liquid temperature distribution will be collectively and appropriately referred to as "liquid temperature distribution information". The liquid recovery amount per unit time to be recovered by the liquid recovery mechanism 30 may be added as the parameter.

Subsequently, the control unit CONT determines the change distribution and the change amount of the image characteristic including the change of the image plane position to be obtained via the projection optical system PL and the liquid 1 on the basis of the determined liquid temperature distribution information (Step S4). In the following explanation, the change amount and the change distribution of the image characteristic will be collectively and appropriately referred to as "image characteristic change information".

Figure 6:
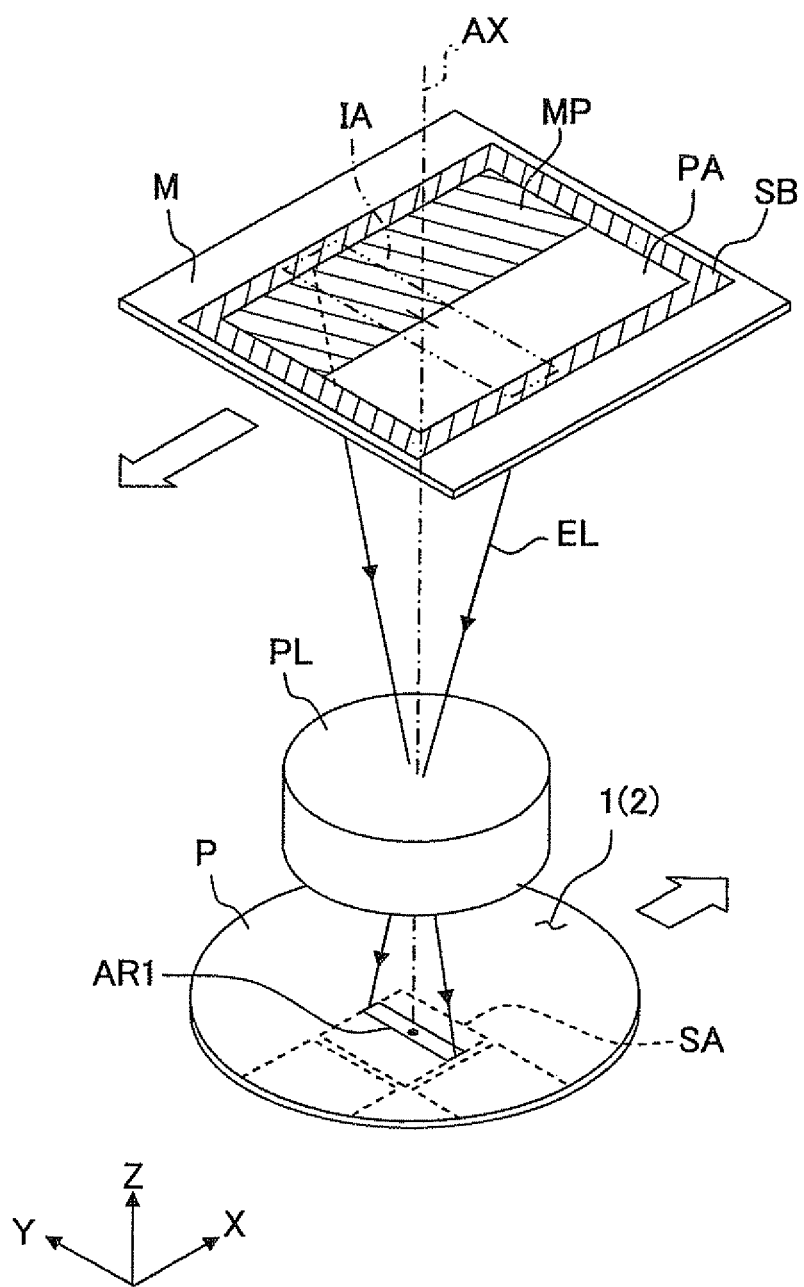
FIG. 6 schematically illustrates a state in which a substrate is subjected to the liquid immersion exposure with a pattern of the mask.
Figure 7:
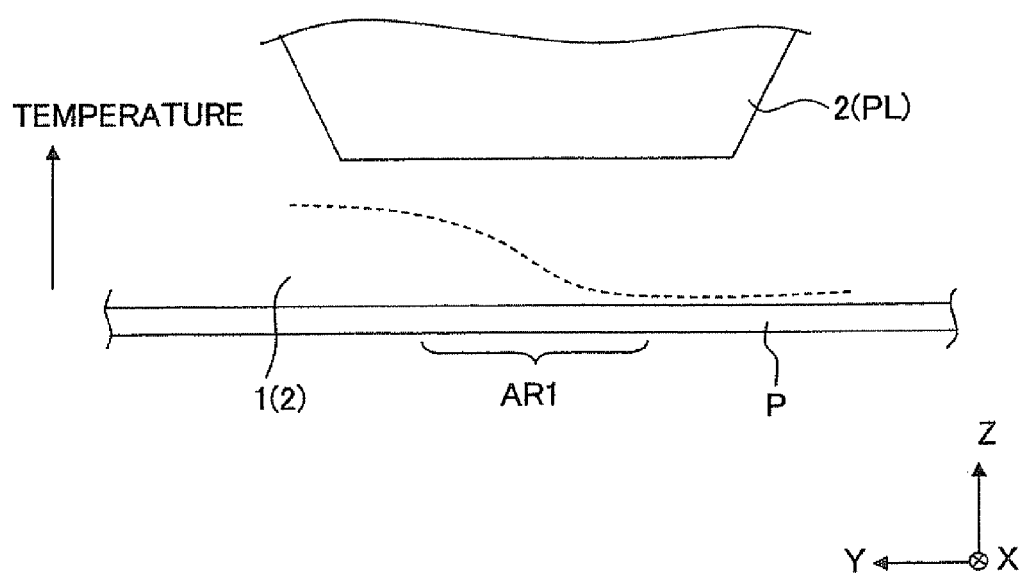
FIG. 7 schematically illustrates a situation in which the position of the image plane, which is obtained via a projection optical system and a liquid, is changed depending on the temperature distribution of the liquid.

An explanation will now be made with reference to FIGS. 6 and 7 about the temperature change of the liquid 1 disposed between the projection optical system PL and the substrate P depending on the distribution of the pattern MP on the mask M. FIG. 6 schematically shows a state in which the liquid immersion exposure is performed with the pattern MP of the mask M via the projection optical system PL and the liquid 1 in the liquid immersion area AR2. FIG. 7 schematically shows the temperature distribution of the liquid. The liquid 1 is omitted from the illustration in FIG. 6 for the convenience of explanation. As shown in FIG. 6, when an approximately half portion of the pattern area PA on the mask M is an area in which the density of the chromium pattern MP is high, a larger amount of the exposure light beam EL comes into the other half of the projection area AR1 as compared with one half of the projection area AR1 on the substrate P, because the light transmittance is low in the high density area. Accordingly, the light amount distribution (illuminance distribution) arises for the exposure light beam EL coming into the liquid 1 disposed between the projection optical system PL and the substrate P depending on the pattern distribution of the mask M. Further, as shown in FIG. 7, the temperature inclination (change of the temperature distribution) in the Y axis direction arises in the liquid 1 as depicted by a dotted line. The temperature change of the liquid 1 causes the change of the refractive index of the liquid 1. Therefore, the situation shown in FIG. 7 brings about the change of the image plane such that the inclination is principally caused about the X axis, depending on the temperature change of the liquid 1. That is, the angle of refraction, which is obtained when the light beam comes into the liquid and passes through the liquid, also exhibits the dependency on the temperature, because the refractive index of the liquid changes depending on the temperature of the liquid. As a result, the image is distorted (the image is partially contracted or expanded in the Y direction).

In view of the above, the control unit CONT determines the information about the temperature distribution of the liquid 1 on the basis of the distribution of the pattern on the mask M as well as the distribution of the exposure light beam EL which comes into the liquid 1 disposed between the projection optical system PL and the substrate P to approximate or estimate the image characteristic change (for example, the change of the position of the image plane) on the basis of the information about the determined temperature distribution.

Figure 8A:
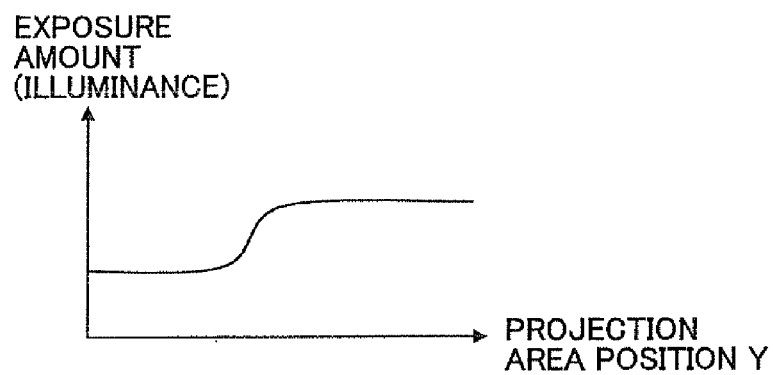
FIGS. 8A to 8C schematically show a procedure to determine the correction amount for correcting the change of the image plane position depending on the distribution of the exposure light beam.
Figure 8B:
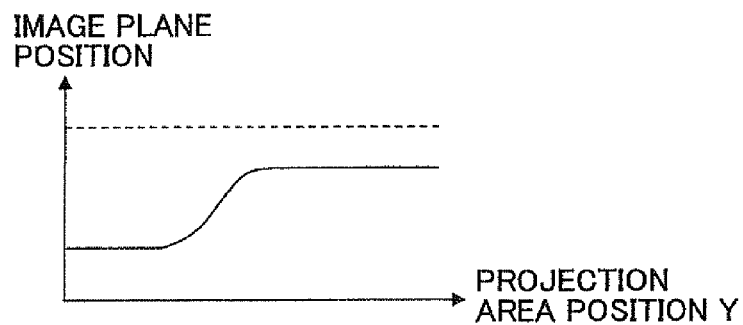
Figure 8C:
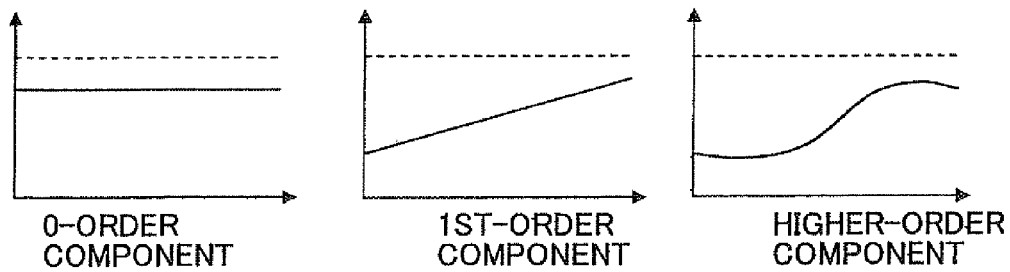

The control unit CONT determines the correction amount (correction information) to correct the image characteristic on the basis of the determined image characteristic change information (Step S5). An explanation will now be made with reference to FIG. 8 about an exemplary procedure for determining the correction amount. The following explanation will be made about a case in which the position of the image plane formed via the projection optical system PL and the liquid 1 is changed depending on the change of the temperature distribution of the liquid 1, in order to simplify the explanation. For example, as shown in FIG. 8A, it is assumed that the illuminance distribution in the Y axis direction of the projection area AR1 of the projection optical system PL is provided as follows. That is, the exposure amount (illuminance) is constant until arrival at a certain position in the +Y direction, the exposure amount is thereafter increased to a predetermined value, and then the exposure amount is constant at the predetermined value. On this assumption, the image plane, which is formed via the projection optical system PL and the liquid 1, is similarly in a state as shown in FIG. 8B depending on the temperature distribution as well. Accordingly, the control unit CONT divides the determined image characteristic change component (image plane position change component) into a plurality of components, i.e., the 0-order component as the offset component, the 1st-order component as the inclination component, and the higher-order component as shown in FIG. 8C. Further, the control unit CONT determines the correction amounts for the respective components respectively. The correction amounts can be used to perform the correction by controlling the exposure apparatus as follows. For example, as for the 0-order component and the 1st-order component concerning the change of the image plane, the positional relationship between the surface of the substrate P and the image plane formed via the projection optical system PL and the liquid 1 is corrected by correcting the driving (posture) of the substrate stage PST. The higher-order component is corrected by driving the image formation characteristic control unit 3 of the projection optical system PL. In this embodiment, the projection area AR1 has the slit shape extending in the Y axis direction. Therefore, in order to adjust the position of the substrate stage PST during the scanning exposure, it is enough to principally perform the positional adjustment (focus adjustment) in relation to the Z axis direction and the tilt adjustment (rolling adjustment) in the θX direction. Of course, when the width of the projection area AR1 in the X axis direction is large, the tilt adjustment (pitching adjustment) in the θY direction is performed during the scanning exposure in order to make the position of the image plane to coincide with the position of the surface of the substrate. The control unit CONT stores, in the storage unit MRY, the correction amounts (correction information) corresponding to the position of the mask M in the scanning direction (X axis direction).

After the determination of the correction amount in order to make coincidence between the positions of the surface of the substrate P and the image plane formed via the projection optical system PL and the liquid 1, the control unit CONT performs the liquid immersion exposure process (Step S6) while adjusting the posture of the substrate P (inclination of the substrate P, position in the Z axis direction) on the basis of the correction amount determined as described above. That is, as shown in FIG. 1, the control unit CONT uses the substrate transport system to load the substrate P on the substrate stage PST, and then the control unit CONT drives the liquid supply mechanism 10 to start the liquid supply operation for supplying the liquid onto the substrate P. The liquid 1, which is fed from the first and second liquid supply sections 11, 12 respectively in order to form the liquid immersion area AR2, is supplied onto the substrate P through the supply tubes 11A, 12A and the first and second supply members 13, 14 to form the liquid immersion area AR2 between the projection optical system PL and the substrate P. In this situation, the supply ports of the first and second supply members 13, 14 are arranged on the both sides in the X axis direction (scanning direction) of the projection area AR1. The control unit CONT executes the control to simultaneously supply the liquid 1 onto the substrate P on the both sides of the projection area AR1 from the supply ports of the liquid supply mechanism 10. Accordingly, the liquid 1, which is supplied onto the substrate P, forms, on the substrate P, the liquid immersion area AR2 in a range wider than at least the projection area AR1.

In this embodiment, when the liquid 1 is supplied to the substrate P from the both sides in the scanning direction of the projection area AR1, the control unit CONT controls the liquid supply operation of the first and second liquid supply sections 11, 12 of the liquid supply mechanism 10 so that the liquid supply amount per unit time, which is to be supplied from the side in front of the projection area AR1 in relation to the scanning direction, is set to be larger than the liquid supply amount to be supplied from the side opposite thereto. For example, when the exposure process is performed while moving the substrate P in the +X direction, the control unit CONT performs the setting so that the liquid amount from the −X side with respect to the projection area AR1 (i.e., from the supply ports 13A) is larger than the liquid amount from the +X side (i.e., from the supply ports 14A). On the other hand, when the exposure process is performed while moving the substrate P in the −X direction, the control unit CONT performs the setting so that the liquid amount from the +X side with respect to the projection area AR1 is larger than the liquid amount from the −X side.

Further, the control unit CONT controls the first and second liquid recovery sections 33, 34 of the liquid recovery mechanism 30 to perform the liquid recovery operation for recovering the liquid 1 from the surface of the substrate P concurrently with the supply operation for supplying the liquid 1 by the liquid supply mechanism 10. Accordingly, the liquid 1 on the substrate P, which is supplied from the supply ports of the first and second supply members 13, 14 and which outflows to the outside of the projection area AR1, is recovered from the recovery ports of the first and second recovery members 33, 34. As described above, the liquid recovery mechanism 30 can efficiently recover the liquid 1 from the surface of the substrate P through the recovery ports, because the recovery ports are provided to surround the projection area AR1.

The control unit CONT performs the liquid immersion exposure while controlling the relationships of the inclination and the position in the Z axis direction between the substrate P and the image plane by the aid of the image formation characteristic control unit 3 and the substrate stage-driving unit PSTD on the basis of the correction information stored in the storage unit MRY and the result of the detection of the position information of the surface of the substrate P detected by the focus-detecting system 4.

Accordingly, even when the image plane position is changed depending on the change of the pattern distribution of the mask M, i.e., the change of the temperature distribution of the liquid 1 depending on the distribution of the exposure light beam EL which comes into the projection area AR1, it is possible to perform the scanning exposure for the shot area (SA) on the substrate P while substantially making coincidence between the surface of the substrate P (exposure surface) and the image plane formed via the projection optical system PL and the liquid 1. Accordingly, it is possible to accurately form the desired pattern on the substrate P.

As explained above, the adjustment is performed for the projection state, which includes, for example, the adjustment for the posture and the position of the substrate P during the liquid immersion scanning exposure and the adjustment for the position of the image plane of the projection optical system PL based on the use of the image formation characteristic control unit so that the desired pattern image is projected onto the substrate P on the basis of the distribution information of the pattern MP of the mask M. Accordingly, it is possible to perform the accurate pattern transfer.

The exemplary embodiment shown in FIGS. 6 and 7 is illustrative of the case in which the pattern distribution in the illumination area IA on the mask M is not changed so much as the mask M is moved. However, in ordinary cases, the pattern distribution in the illumination area IA of the exposure light beam EL on the mask M is changed as the mask M is moved. In such circumstances, the distribution of the exposure light beam EL which comes into the projection area AR1 (liquid 1) is changed as the mask M is moved. The temperature distribution of the liquid 1 is changed due to the change of the distribution of the exposure light beam EL. Therefore, the position of the image plane is also changed depending on the temperature distribution of the liquid 1. Therefore, it is feared that the pattern image to be projected onto the substrate P may be deteriorated.

However, in this embodiment, the control unit CONT stores the correction information corresponding to the position of the mask M in the scanning direction (X axis direction). The correction information is read depending on the position of the mask M (depending on the result of the measurement performed by the laser interferometer 51) during the exposure for the shot area SA on the substrate P. Therefore, the surface of the substrate P (exposure surface) can be correctly adjusted to match the image plane.

In this embodiment, when the pattern distribution of the mask M in the non-scanning direction (Y axis direction) is changed only slightly, it is also allowable to consider only the change of the pattern distribution in the illumination area IA caused by the movement of the mask M, i.e., the change of the intensity of the exposure light beam EL which comes into the liquid 1. In this case, the control unit CONT determines the totalized value (totalized light amount distribution) obtained by totalizing the illuminance distribution in the Y axis direction (longitudinal direction) of the projection area AR1 measured by the optical sensor 20 in relation to the X axis direction. The calculated totalized value is determined while corresponding the value to the position of the mask M in the X axis direction. Accordingly, it is possible to determine the change of the pattern distribution in the illumination area IA caused by the movement of the mask M.

In this embodiment, depending on the change of the image plane caused by the temperature change of the liquid 1, the surface position of the substrate P is adjusted, and the position of the image plane is adjusted by moving a part of the optical element of the projection optical system PL and/or varying the pressure of the space between the optical elements by the aid of the image formation characteristic control unit. However, it is also allowable to perform any one of the adjustment of the surface position of the substrate P and the adjustment of the position of the image plane. Alternatively, the image plane position may be adjusted by moving the position of the mask M with the mask stage MST and/or finely adjusting the wavelength of the exposure light beam. The adjustment of the image plane position can be also achieved by moving and/or exchanging a part of the optical member of the illumination optical system IL. Further alternatively, it is also allowable to adjust the temperature of the optical member (including the projection optical system PL) disposed in the optical path for the exposure light beam EL.

In this embodiment, the explanation has been made about the correction of the change of the image plane caused by the change of the temperature (distribution) of the liquid 1. However, the present invention is not limited to only the change of the image plane. When the image formation characteristic such as the magnification and the distortion is changed on the basis of the temperature distribution of the liquid 1, the image formation characteristic of the pattern image may be also adjusted depending on the distribution information of the pattern MP of the mask M (i.e., the distribution of the exposure light beam EL which comes into the liquid 1). The adjustment of the image formation characteristic can be achieved by moving a part of the optical element of the projection optical system PL and/or adjusting the pressure of the space between the optical elements in the same manner as in the adjustment of the position of the image plane. Alternatively, the adjustment of the image formation characteristic can be also achieved by moving the mask M and/or finely adjusting the wavelength of the exposure light beam EL. Further alternatively, the adjustment of the image formation characteristic can be also achieved by moving and/or exchanging a part of the optical member of the illumination optical system IL. Further alternatively, it is also allowable to adjust the temperature of the optical member (including the projection optical system PL) disposed in the optical path for the exposure light beam EL. Further alternatively, it is also allowable to adjust the state of the polarization of the exposure light beam EL and/or the state of the wavefront, when the image formation characteristic is adjusted.

In this embodiment, when the position is adjusted for the surface of the substrate P and the image plane formed via the projection optical system PL and the liquid 1 during the liquid immersion scanning exposure, the information about the surface position of the substrate P is detected by the focus-detecting system 4, and the substrate stage PST is driven on the basis of the result of the detection performed by the focus-detecting system 4 to adjust the position and the posture of the substrate P. In this case, the detecting light beam, which is radiated obliquely from the upper position onto the surface of the substrate P from the light-emitting section 4a of the focus-detecting system 4, passes through the liquid 1. However, there is such a possibility that the refractive index may be changed depending on the temperature change of the liquid 1, and any error may arise in the detected value of the focus for the surface of the substrate P. In such a situation, the storage unit MRY previously stores the relationship between the temperature (temperature change amount) and the refractive index (refractive index change amount) of the liquid 1 to determine the refractive index of the liquid 1 on the basis of the relationship and the information about the temperature change of the liquid 1 determined in Step S3. On condition that the thickness of the liquid 1 is considered, the detected value of the focus is corrected on the basis of the determined refractive index. Accordingly, even when the temperature of the liquid 1 is change, it is possible to determine the information about the surface position of the substrate P. Therefore, it is possible to adjust and match the image plane and the surface of the substrate P more correctly. Alternatively, the adjustment amount of the positional relationship between the image plane and the substrate surface, which is based on the detected value of the focus-detecting system 4, may be corrected on the basis of the relationship between the refractive index and the temperature of the liquid 1 stored in the storage unit MRY.

The measurement of the pattern distribution of the mask M as described above and the determination of the image characteristic change information and the liquid temperature distribution information based on the result of the measurement may be performed at least every time when the mask M is changed. However, even when the mask M is not changed, the measurement and the determination as described above may be performed periodically. Further, the pattern distribution information of the mask M may be stored in the storage unit MRY. Accordingly, when the predetermined mask M is used, then the mask M is once unloaded, and then the mask M is used again, the measurement of the pattern distribution of the mask M may be omitted, and the pattern distribution information stored in the storage unit MRY may be used as it is.

In this embodiment, the pattern distribution information of the mask M is determined. However, the change of the temperature distribution of the liquid may be determined by using the illuminance distribution information measured by the optical sensor 20 as it is. In this case, the temperature of the liquid 1 is changed depending on various parameters including, for example, the pattern density of the mask M, the output of the exposure light source, the liquid supply amount (or the flow rate) per unit time for forming the liquid immersion area AR2, and the specific heats of the liquid and the substrate P. It is enough that the storage unit MRY previously stores, as a data table, the relationship between the illuminance distribution and the liquid temperature change amount while considering the parameters as described above. The relationship between the illuminance distribution and the liquid temperature change amount may be verified by previously performing an experiment. In the case of the liquid immersion exposure apparatus in which the type of the liquid 1 for forming the liquid immersion area AR2 is changeable, the storage unit MRY may previously store data tables corresponding to the respective liquids.

It is considered that the temperature of the liquid 1 arranged between the projection optical system PL and the substrate P is changed depending on the reflected light beam of the exposure light beam EL reflected by the surface of the substrate P. In such a case, the reflectance of the surface of the substrate P may be used as one parameter of the data table.

In this embodiment, after the mask M is placed on the mask stage MST, the distribution information of the exposure light beam EL is measured via the projection optical system PL by using the optical sensor 20 provided on the substrate stage PST, and the distribution of the pattern MP of the mask M is measured on the basis of the result of the measurement. However, for example, the following procedure is also available. That is, the pattern distribution information of the mask M (for example, the density and the transmittance of the mask at each of the positions of the mask) is determined from the designed value. The obtained value is stored in the storage unit MRY. When the liquid immersion scanning exposure is performed, the temperature change and/or the change of the temperature distribution of the liquid 1 is approximated or estimated while considering the stored distribution information. The adjustment of the projection state such as the adjustment of the image characteristic and/or the adjustment of the substrate position is performed on the basis of the result of the approximation or estimate.

Figure 9:
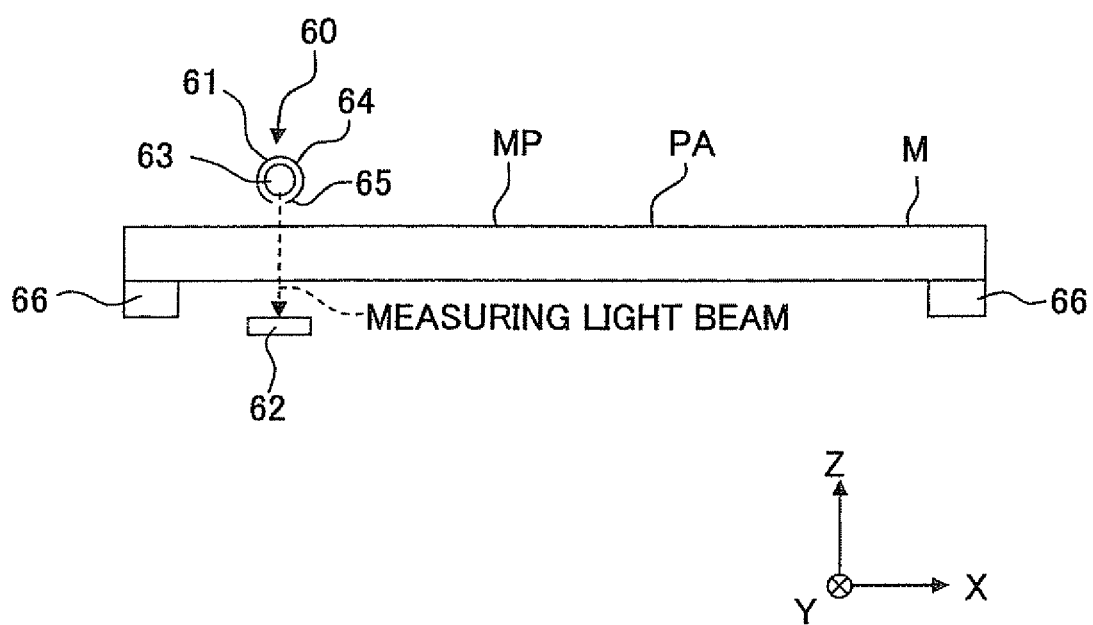
FIG. 9 schematically shows another method for measuring the pattern distribution of the mask.

Alternatively, as shown in FIG. 9, a pattern-measuring unit 60 for measuring the pattern distribution of the mask M may be provided at a position different from the mask stage MST. As shown in FIG. 9, the pattern-measuring unit 60 includes a light-emitting section 61 which is provided over the mask M supported by a support section 66 and which radiates the measuring light beam onto the mask M, and a light-receiving section 62 which is provided below the mask M and which receives the light beam transmitted through the mask M on the basis of the measuring light beam radiated on the mask M. The measuring light beam is radiated from the light-emitting section 61 while relatively moving the mask M in the X axis direction with respect to the light-emitting section 61 and the light-receiving section 62. The light-receiving section 62 receives the transmitted light through the mask M while making synchronous movement together with the light-emitting section 61. Accordingly, the transmitted light beam of the measuring light beam is received for the entire surface of the pattern area PA of the mask M. In this arrangement, the following arrangement may be adopted for the relative movement of the mask M and the light-emitting section 61 and the light-receiving section 62. That is, the mask M may be moved in the X axis direction together with the support section 66 in a state in which the positions of the light-emitting section 61 and the light-receiving section 62 are fixed. Alternatively, the light-emitting section 61 and the light-receiving section 62 may be synchronously moved in the X axis direction in a state in which the position of the mask M is fixed. Further alternatively, both of the mask M and the light-emitting section 61 and the light-receiving section 62 may be moved oppositely to one another in the X axis direction.

The result of the measurement performed by the light-receiving section 62 is outputted to the control unit CONT. The control unit CONT determines the pattern distribution of the mask M on the basis of the result of the measurement performed by the light-receiving section 62 (pattern-measuring unit 60). The information about the pattern density of the mask M measured by the pattern-measuring unit 60 is stored in the storage unit MRY. When the liquid immersion scanning exposure is performed, the adjustment of the image characteristic and the adjustment of the substrate position (adjustment of the projection state) are performed on the basis of the correction information determined from the stored pattern distribution.

It is considered that a situation arises such that the illuminance distribution of the exposure light beam EL which arrives at the substrate stage PST (on the side of the image plane of the projection optical system PL) via the projection optical system PL and the mask M supported by the mask stage MST does not correspond to the pattern (pattern distribution) of the mask M. However, even in such a situation, the pattern can be satisfactorily transferred to the substrate P by directly determining the change of the temperature distribution of the liquid and performing the adjustment of the image characteristic and/or the adjustment of the posture of the substrate P, in place of the determination of the pattern distribution of the mask from the illuminance distribution measured by the optical sensor 20 disposed on the substrate stage PST as described above.

The optical sensor 20 used in this embodiment has a plurality of light-receiving surfaces in the non-scanning direction. However, the illuminance distribution of the exposure light beam EL may be determined by moving an optical sensor 20 having a small light-receiving surface in the X axis direction, in the Y axis direction, or in both of the X axis direction and the Y axis direction by the substrate stage PST.

Second Embodiment

Next, an explanation will be made about a second embodiment of the exposure apparatus of the present invention with reference to FIG. 10. In this embodiment, the projection state is adjusted by making the adjustment so that any temperature distribution is not generated in the liquid 1 of the liquid immersion area AR2 depending on the pattern distribution of the mask M (distribution of the exposure light beam EL which comes into the projection area AR1), i.e., so that the temperature distribution of the liquid 1 is uniformized. In particular, the adjustment is made so that the temperature distribution is uniform in the Y axis direction as the direction perpendicular to the scanning direction (X axis direction). This embodiment is constructed in the same manner as the first embodiment except for the liquid supply mechanism. In the following explanation, the constitutive portions, which are the same as or equivalent to those of the first embodiment described above, are designated by the same reference numerals, any explanation of which will be simplified or omitted.

Figure 10:
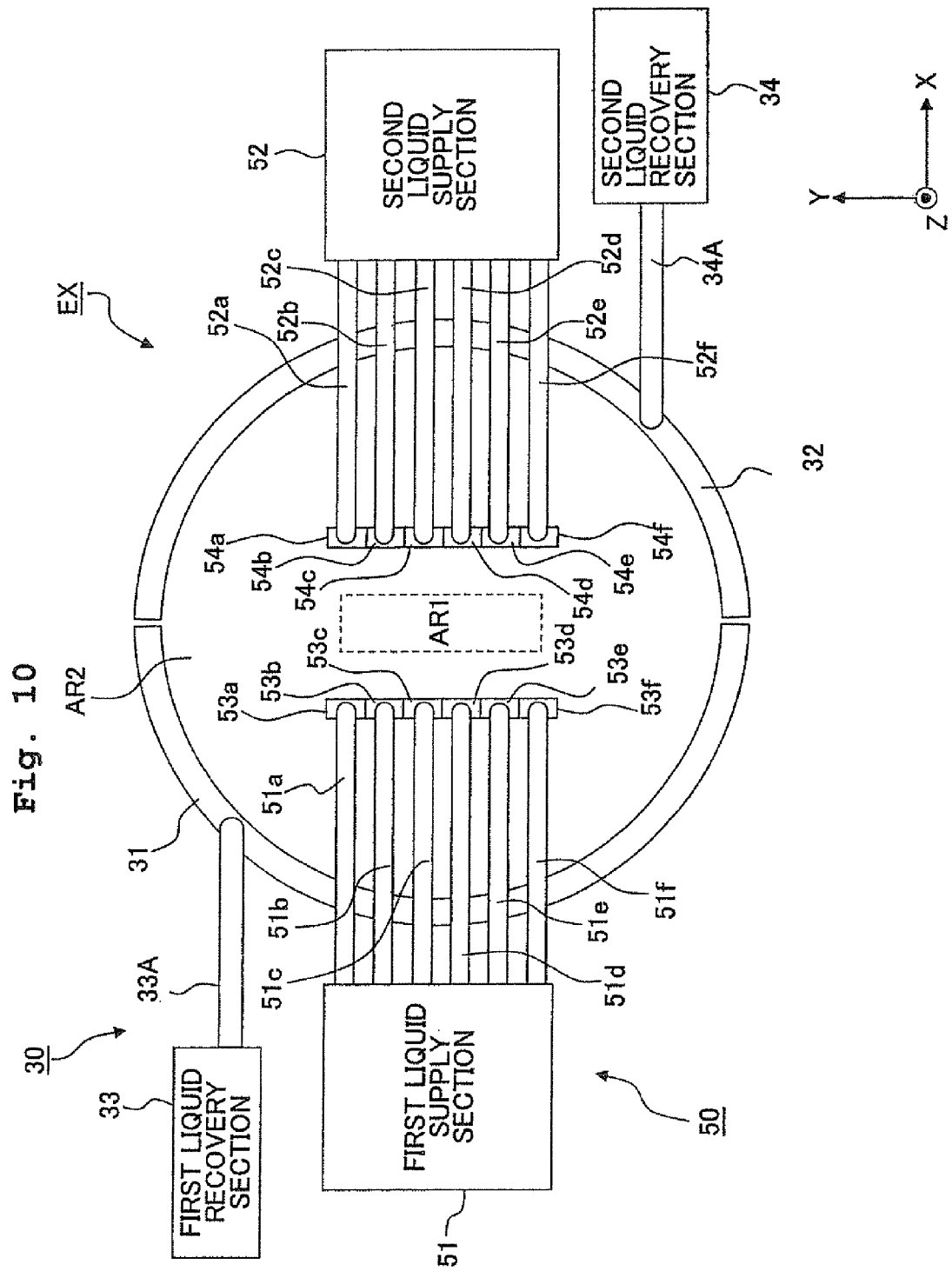
FIG. 10 shows a schematic arrangement illustrating a second embodiment of an exposure apparatus of the present invention.

With reference to FIG. 10, a liquid supply mechanism 50 includes a first liquid supply section 51 and a second liquid supply section 52. First ends of a plurality of supply tubes 51a, 51b, 51c, 51d, 51e, 51f are connected to the first liquid supply section 51. A plurality of supply ports 53a, 53b, 53c, 53d, 53e, 53f, which are arranged in the non-scanning direction (Y axis direction) and which are disposed closely to the substrate P, are provided at second ends of the supply tubes 51a to 51f, respectively. Similarly, first ends of a plurality of supply tubes 52a, 52b, 52c, 52d, 52e, 52f are connected to the second liquid supply section 52. A plurality of supply ports 54a, 54b, 54c, 54d, 54e, 54f, which are arranged in the non-scanning direction (Y axis direction) and which are disposed closely to the substrate P, are provided at second ends of the supply tubes 52a to 52f, respectively. The supply ports 53a to 53f, 54a to 54f of the liquid supply mechanism 50 are provided in a plurality of directions with respect to (the center of) the projection area AR1 while being separated therefrom by different distances. In this embodiment, the supply ports 53a to 53f, 54a to 54f are arranged and aligned in the Y axis direction respectively, and the supply ports supply the liquid 1 from a plurality of positions separated from each other in the Y axis direction respectively.

The first and second liquid supply sections 51, 52 are provided with a plurality of temperature-adjusting mechanisms which are connected to the respective supply tubes 51a to 51f, 52a to 52f. The liquid 1 can be supplied onto the substrate P from the respective supply ports 53a to 53f, 54a to 54f at mutually different temperatures respectively. That is, the liquid supply mechanism 50, which supplies the liquid 1 onto the substrate P in order to form the liquid immersion area AR2 in this embodiment, is capable of supplying the liquid 1 from the plurality of positions at mutually different temperatures respectively. The liquid 1 is supplied at the plurality of positions. The temperature of the liquid 1 is successfully allowed to differ depending on the liquid supply positions, i.e., the respective positions of the supply ports 53a to 53f, 54a to 54f. The supply ports 53a to 53f, 54a to 54f are capable of supplying the liquid 1 at the mutually different temperatures from the plurality of positions separated from each other in the Y axis direction as the direction perpendicular to the X axis direction as the scanning direction respectively.

In this embodiment, the liquid 1 is not supplied simultaneously from both of the first liquid supply section 51 and the second liquid supply section 52. The first liquid supply section 51 and the second liquid supply section 52 are used while being switched depending on the scanning direction of the substrate P. That is, when the scanning exposure is performed while moving the substrate P in the +X direction, the first liquid supply section 51 is operated to supply the liquid from the supply ports 53a to 53f. When the scanning exposure is performed while moving the substrate P in the −X direction, the second liquid supply section 52 is operated to supply the liquid from the supply ports 54a to 54f.

The operation of the liquid supply mechanism 50 is controlled by the control unit CONT. The storage unit MRY previously stores the information about the pattern distribution of the mask M. As described above, the distribution of the exposure light beam EL which comes into the liquid 1 disposed between the projection optical system PL and the substrate P is also changed depending on the pattern distribution of the mask M. In this embodiment, the control unit CONT controls the temperature of the liquid to be supplied from each of the supply ports 53a to 53f (or 54a to 54f) of the liquid supply mechanism 50 on the basis of the information about the pattern distribution of the mask M.

For example, when the shot area SA on the substrate P is subjected to the scanning exposure while moving the substrate P in the +X direction, then the liquid 1, which has approximately the same temperature of 23° C. as the temperature in the chamber, is supplied from the supply ports 53d, 53e, 53f, and the liquid, which has a temperature lower than that of the liquid supplied from the supply ports 53d, 53e, 53f, is supplied from the supply ports 53a, 53b, 53c, while considering the pattern distribution of the mask M (distribution of the exposure light beam EL which comes into the liquid 1). Accordingly, even when the distribution (illuminance distribution) of the incoming exposure light beam EL is deviated (see, for example, FIG. 8A), the projection state can be adjusted by uniformizing the temperature distribution of the liquid 1 through which the exposure light beam EL passes. Therefore, the image of the pattern of the mask M can be accurately projected onto the substrate P.

Next, an explanation will be made with reference to FIG. 10 about a method for adjusting the projection state by uniformizing the temperature of the liquid in the liquid immersion area. At first, the distribution of the exposure light beam EL which comes into the liquid 1 is previously determined (Step 1) as explained with reference to FIG. 4, before performing the liquid immersion exposure. Further, the pattern distribution of the mask M is determined (Step S2), and the temperature distribution of the liquid 1 is determined (Step S3). In this case, in Step S3, the temperature distribution information of the liquid 1 in the Y axis direction (non-scanning direction) as the direction intersecting the scanning direction (X axis direction) is especially determined. The control unit CONT adjusts the temperature of the liquid to be supplied from each of the respective supply ports 53a to 53f on the basis of the determined liquid temperature distribution information. Accordingly, it is possible to uniformize the temperature of the liquid 1 for forming the liquid immersion area AR2 especially in the Y axis direction. Further, it is possible to avoid the deterioration of the pattern image which would be otherwise caused by the temperature distribution of the liquid.

In this embodiment, the temperature of the liquid 1 to be supplied onto the substrate P is adjusted to uniformize the temperature of the liquid 1 between the projection optical system PL and the substrate P. However, the temperature distribution of the liquid 1 of the liquid immersion area AR2 may be uniformized by allowing any non-exposing light beam (for example, any infrared ray not photosensitizing the resist) to come into a portion at which the exposure light beam scarcely incomes so that the liquid disposed at the portion is heated.

In this embodiment, when the adjustment (adjustment for the projection state) is performed for the image which is projected onto the substrate depending on the pattern distribution of the mask M, it is also allowable to combine the adjusting method of this embodiment and the adjusting method of the first embodiment. For example, the 0-order component of the image plane position change explained with reference to FIG. 8 is corrected by adjusting the position of the surface of the substrate P by using the substrate stage PST. The 1st-order component of the image plane position change is corrected by adjusting the image characteristic of the projection optical system PL by using, for example, the image formation characteristic control unit 3. The higher-order component of the image plane position change is corrected by adjusting the temperature of the liquid to be supplied from each of the plurality of supply ports 53a to 53f respectively.

This embodiment is constructed such that the liquid temperature distribution in the non-scanning direction of the liquid immersion area AR2 is uniformized by mutually changing the temperature of the liquid 1 to be supplied from each of the respective supply ports 53a to 53f. However, for example, the liquid temperature distribution in the non-scanning direction of the liquid immersion area AR2 can be also uniformized by changing the supply amounts of the liquid to be supplied per unit time from the respective supply ports 53a to 53f respectively. In this case, the increase in the temperature of the liquid is suppressed at places corresponding to larger supply amounts of the liquid per unit time. On the contrary, the increase in the temperature of the liquid is facilitated at places corresponding to smaller supply amounts of the liquid per unit time. When the pressure, which is applied to the substrate P by the liquid 1 for forming the liquid immersion area AR2, is changed depending on the supply amount of the liquid to be supplied from the respective supply ports 53a to 53f, and any error arises in the positional adjustment between the surface of the substrate P and the image formation plane of the pattern image, then the positional relationship between the surface of the substrate P and the image formation plane of the pattern image may be corrected depending on the supply amount of the liquid to be supplied from the respective supply ports 53a to 53f. In this embodiment, the liquid temperature distribution in the non-scanning direction of the liquid immersion area AR2 is uniformized by mutually changing the temperature of the liquid 1 to be supplied from each of the respective supply ports 53a to 53f. However, the temperature of the liquid 1 to be supplied from each of the respective supply ports 53a to 53f can be also adjusted respectively so that the liquid temperature distribution in the non-scanning direction of the liquid immersion area AR2 is nonuniform in order that the projection state of the pattern image is adjusted to be a desired state.

This embodiment is constructed such that the liquid 1 is supplied from one side in the X axis direction (scanning direction) with respect to the projection area AR1 of the projection optical system PL. However, the liquid 1 may be supplied from both sides in the X axis direction (scanning direction) in relation to the projection area AR1. Alternatively, one or more liquid supply ports may be provided on one side or both sides in the Y axis direction (non-scanning direction) to supply the liquid 1 in the X axis direction and the Y axis direction. Further alternatively, a plurality of such liquid supply ports may be provided to supply the liquid at different temperatures from the respective supply ports.

Third Embodiment

Figure 11:
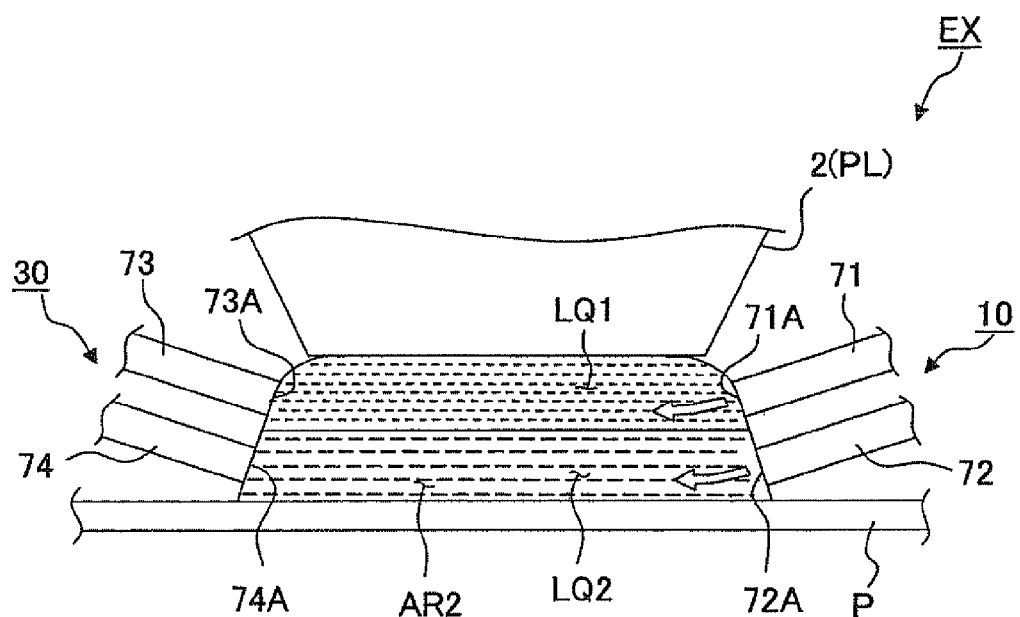
FIG. 11 shows a schematic arrangement illustrating a third embodiment of an exposure apparatus of the present invention.

Next, an explanation will be made with reference to FIG. 11 about a third embodiment of the exposure apparatus EX of the present invention. In this embodiment, the liquid supply mechanism and the liquid recovery mechanism are changed as follows. As shown in FIG. 11, the exposure apparatus EX includes a liquid supply mechanism 10 which has two supply tubes 71, 72 (supply ports 71A, 72A) provided and aligned in the Z axis direction as the direction perpendicular to the X axis direction, and a liquid recovery mechanism 30 which has two recovery tubes 73, 74 (recovery ports 74A, 74A) provided and aligned in the Z axis direction so that the recovery tubes 73, 74 are opposed to the supply tubes 71, 72. The liquid supply mechanism 10 is capable of supplying the liquid from the respective supply ports 71A, 72A at mutually different temperatures. Accordingly, two liquid layers LQ1, LQ2, which have temperatures different from each other, can be formed in the liquid immersion area AR2.

When the liquid is supplied in accordance with the method as described above, for example, the following situation is obtained. That is, the liquid 1, which is supplied in order to form the liquid layer LQ1 as the upper layer to make contact with the optical element 2 disposed at the end portion of the projection optical system PL, can be always supplied at an approximately constant temperature. The liquid 1, which is included in the liquid layer LQ2 as the lower layer to make contact with the surface of the substrate P that tends to undergo the increase in the temperature by being irradiated with the exposure light beam EL, can be supplied while changing the temperature of the liquid 1 depending on the pattern distribution of the mask M (distribution of the incoming exposure light beam). When the liquid 1, which is supplied in order to form the liquid layer LQ1 as the upper layer, is always adjusted to have the substantially constant temperature, it is possible to suppress the transfer of the thermal change caused by the heat generated by the substrate P to the optical element 2 disposed at the end portion of the projection optical system PL. The liquid, which is supplied in order to form the liquid layer LQ2 as the lower layer, may have a temperature which is lower than the temperature of the liquid supplied in order to form the liquid layer LQ1 as the upper layer. Of course, the temperature of the liquid 1 for forming the liquid layer LQ1 as the upper layer may be changed depending on the pattern distribution of the mask M (distribution of the incoming exposure light beam). The temperature of the liquid to be supplied from the respective supply ports 71A, 72A may be adjusted so that the temperature of the liquid of the liquid layer LQ1 as the upper layer is approximately the same as the temperature of the liquid of the liquid layer LQ2 as the lower layer, or the temperature may be adjusted so that any temperature difference appears.

In this embodiment, the two supply tubes and the two recovery tubes are provided in the Z axis direction respectively. However, three or more or any arbitrary number of supply tubes and recovery tubes may be arranged and aligned in the Z axis direction respectively. Accordingly, the liquid supply mechanism 10 can supply the liquid 1 from a plurality of positions, separated from each other in the Z axis direction, at mutually different temperatures. FIG. 11 merely shows one set of the supply tubes 71, 72 and the recovery tubes 73, 74 separated from each other in the X axis direction. However, a plurality of sets of supply tubes and recovery tubes may be arranged and aligned in the Y axis direction. Also in this embodiment, it is possible to bring about different supply amounts of the liquid supplied per unit time from the respective supply ports 71A, 72A respectively. In this case, it is possible to provide different supply amounts for the supply port 71A and the supply port 72A so that the temperature of the liquid of the liquid layer LQ1 is the same as the temperature of the liquid of the liquid layer LQ2, or a desired difference in temperature appears. It is also possible to provide different supply amounts for the supply port 71A and the supply port 72A so that the velocity of the flow of the liquid of the liquid layer LQ1 is approximately the same as the velocity of the flow of the liquid of the liquid layer LQ2, or a desired difference in velocity appears.

Fourth Embodiment

Figure 12:
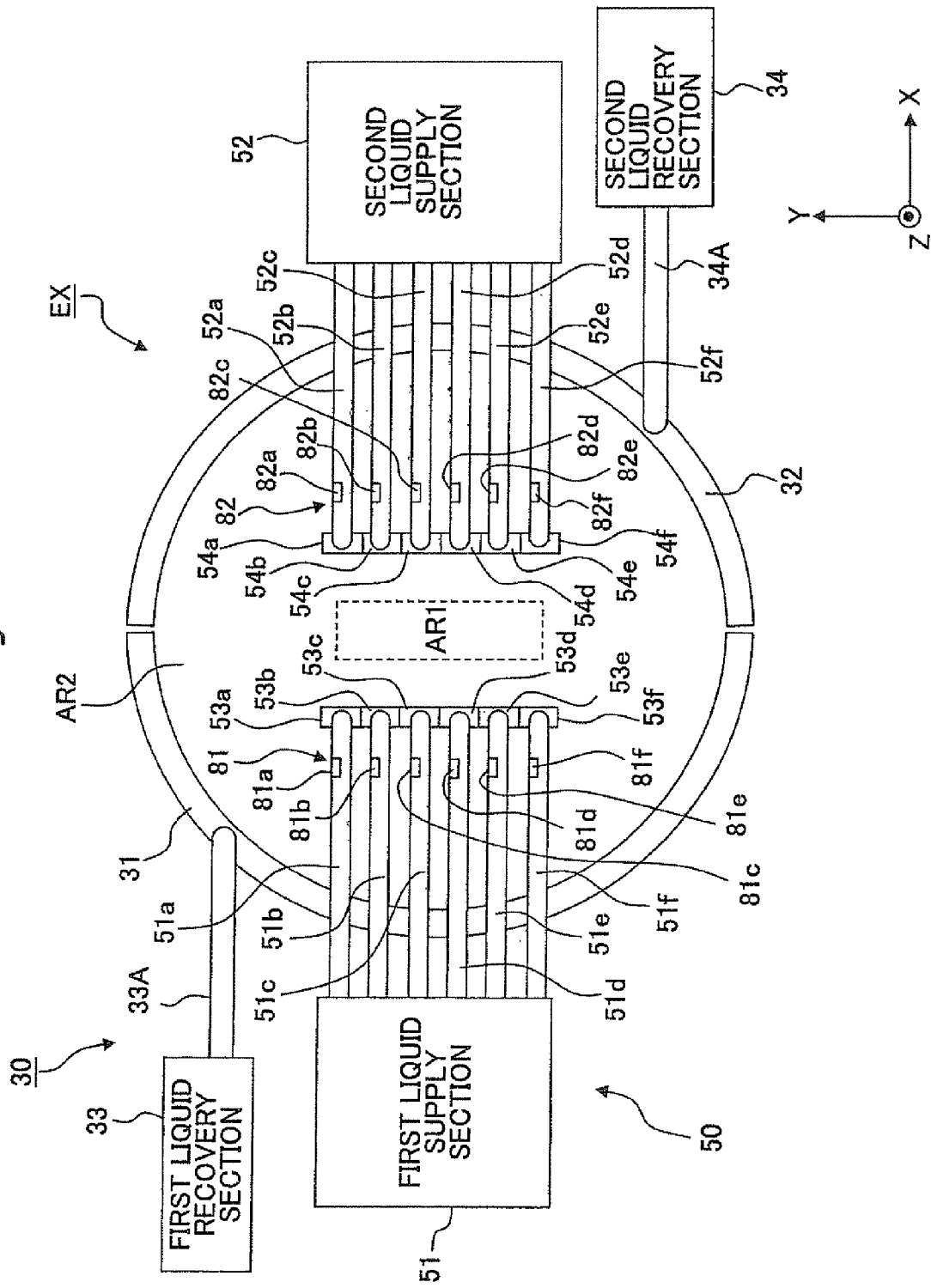
FIG. 12 shows a schematic arrangement illustrating a fourth embodiment of an exposure apparatus of the present invention.

Next, an explanation will be made with reference to FIG. 12 about a fourth embodiment of the exposure apparatus EX of the present invention. This embodiment is constructed such that a temperature-measuring unit (sensor) for measuring the temperature of the liquid as described below is provided, and first and second liquid supply sections are used as liquid recovery mechanisms. As shown in FIG. 12, the exposure apparatus EX includes a temperature sensor 81 which has a plurality of sensor elements 81a to 81f separated from each other in the Y axis direction and a temperature sensor 82 which has sensor elements 82a to 82f, to measure the temperature of the liquid. The sensor elements 81a to 81f are provided on supply tubes 51a to 51f respectively. The sensor elements 82a to 82f are provided on supply tubes 52a to 52f respectively.

The first liquid supply section 51 and the second liquid supply section 52 of this embodiment function as the liquid recovery mechanisms for recovering the liquid 1 from the surface of the substrate P respectively. That is, the first and second liquid supply sections 51, 52 are capable of sucking and recovering the liquid 1 from the surface of the substrate P by the aid of supply ports and supply tubes. For example, the second liquid supply section 52 functions as the liquid recovery mechanism to recover the liquid 1 from the surface of the substrate P during the period in which the first liquid supply section 51 supplies the liquid 1 onto the substrate P. When the recovered liquid 1 passes through the supply tubes (recovery tubes) 52a to 52f, the temperature is measured by the sensor elements 82a to 82f. In other words, the liquid 1 can be recovered from the surface of the substrate P by the aid of the recovery ports (supply ports) 54a to 54e provided at a plurality of positions separated from each other in the Y axis direction, of the second liquid supply section 52 which functions as the liquid recovery mechanism, and the temperature of the liquid 1 recovered at a plurality of positions can be measured by the plurality of sensor elements 82a to 82f respectively. Similarly, the first liquid supply section 51 functions as the liquid recovery mechanism to recover the liquid 1 from the surface of the substrate P during the period in which the second liquid supply section 52 supplies the liquid 1 onto the substrate P. When the recovered liquid 1 flows through the supply tubes (recovery tubes) 51a to 51f, the temperature is measured by the sensor elements 81a to 81f.

Figure 13:
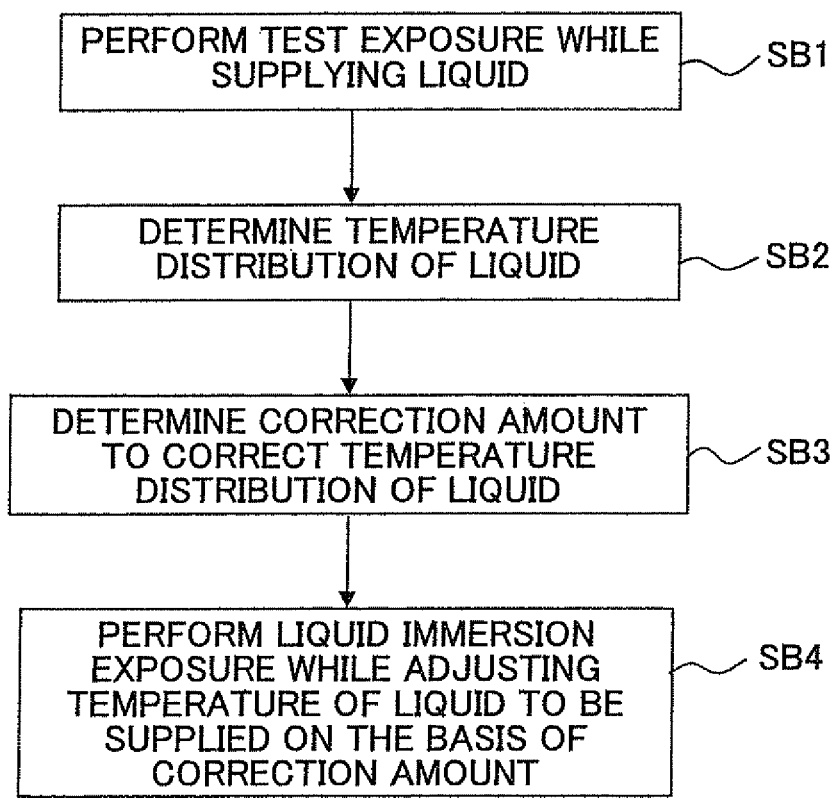
FIG. 13 shows a flow chart illustrating an embodiment of an exposure method of the present invention.

Next, an explanation will be made with reference to a flow chart shown in FIG. 13 about a procedure of the liquid immersion exposure based on the use of the exposure apparatus EX shown in FIG. 12. At first, the mask M is loaded on the mask stage MST, and the substrate P is loaded on the substrate stage PST. Subsequently, the control unit CONT drives the liquid supply mechanism 50 and the liquid recovery mechanism 30 respectively to form the liquid immersion area AR2 between the projection optical system PL and the substrate P. Subsequently, the mask M is illuminated with the exposure light beam EL to perform the test exposure for the substrate P (Step SB1). The liquid 1 of the liquid immersion area AR2 is irradiated with the exposure light beam EL in only an area which corresponds to the slit-shaped projection area AR1 having the longitudinal direction as the Y axis direction. Therefore, the temperature distribution is principally generated in the Y axis direction. In this procedure, a test substrate, which is different from the substrate for producing the device, may be used as the substrate P.

For example, when the liquid is supplied by the second liquid supply section 52 in order to perform the liquid immersion exposure while moving the substrate P in the −X direction, the first liquid supply section 51 functions as the liquid recovery mechanism. Accordingly, the liquid 1 on the substrate P is recovered by the aid of the recovery tubes (supply tubes) 51a to 51f. The temperature of the liquid flowing through each of the recovery tubes 51a to 51f respectively is measured by the sensor elements 81a to 81f, respectively. The results of the temperature measurement performed by the respective sensor elements 81a to 81f are outputted to the control unit CONT. The control unit CONT determines the temperature distribution of the liquid 1 in the Y axis direction on the basis of the respective results of the detection performed by the plurality of sensor elements 81a to 81f aligned in the Y axis direction (Step SB2). The first liquid supply section 51, which functions as the liquid recovery mechanism in this procedure, is constructed so that an amount of the liquid, with which the liquid temperature can be measured, is recovered.

The control unit CONT determines the correction amounts for the temperature of the liquid to be supplied from each of the respective supply ports 54a to 54f connected to the second liquid supply section 52 on the basis of the liquid temperature distribution determined in Step SB2 so that the desired pattern image is projected onto the substrate P via the projection optical system PL and the liquid 1, i.e., the temperature of the liquid 1 in the liquid immersion area AR2 is uniform in the Y axis direction (Step SB3).

Subsequently, the control unit CONT performs the liquid immersion exposure (hereinafter referred to as "production exposure") to actually produce the device while adjusting the temperature of the liquid 1 to be supplied onto the substrate P from each of the supply ports 54a to 54f on the basis of the determined correction amounts for the liquid temperature (Step SB4). The first liquid supply section 51 does not function as the liquid recovery section (function is canceled) during the production exposure.

On the other hand, when the exposure is performed while moving the substrate P in the +X direction, the second liquid supply section 52 functions as the liquid recovery mechanism. The test exposure and the production exposure are performed in accordance with the same procedure as the procedure described above.

In this embodiment, the following procedure is adopted as the method for adjusting the projection state. That is, the temperature distribution of the liquid 1 is determined (Step SB2), and then the temperature of the liquid 1 to be supplied is adjusted so that the desired pattern image is projected onto the substrate P. However, it is also allowable to perform, for example, the adjustment of the supply amount of the liquid 1 per unit time, the adjustment of the position and the posture of the substrate P, and/or the adjustment of the image characteristic of the projection optical system PL as described above. It is also allowable to perform the various adjustment processes in combination. In this embodiment, the temperature of the liquid to be supplied from each of the respective supply ports are adjusted on the basis of the results of the detection performed by the plurality of sensor elements 81a to 81f so that the temperature of the liquid 1 in the liquid immersion area AR2 is uniform. However, the correction amounts of the temperature of the liquid to be supplied from each of the respective supply ports may be determined after analyzing the pattern formed on the substrate P by the test exposure. In this procedure, the temperature of the liquid to be supplied from each of the respective supply ports may be adjusted so that the temperature of the liquid 1 in the liquid immersion area AR2 is nonuniform.

Fifth Embodiment

Figure 14:
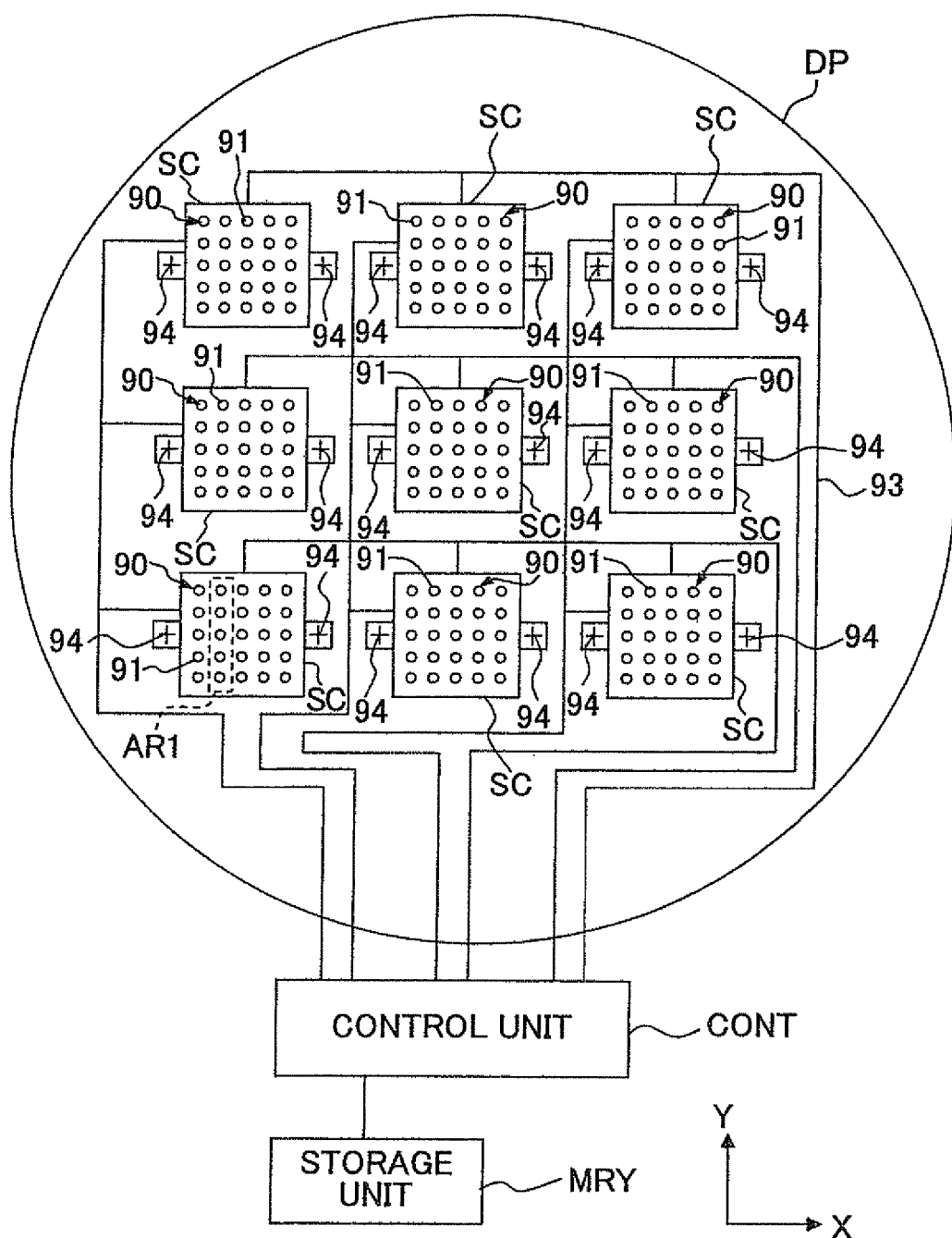
FIG. 14 shows a schematic arrangement illustrating a fifth embodiment of an exposure apparatus of the present invention.

Next, an explanation will be made with reference to FIG. 14 about a fifth embodiment of the exposure apparatus EX of the present invention. This embodiment is constructed such that the temperature distribution of the liquid is determined by using a dummy substrate. As shown in FIG. 14, a plurality of temperature sensors 90 are provided on the surface of the dummy substrate DP. The dummy substrate DP has approximately the same size and the same shape as those of the substrate P for producing the device. The dummy substrate DP can be arranged on (can be held by) the substrate stage PST as a movable member which is movable while holding the substrate P. The dummy substrate DP is detachable with respect to the substrate stage PST. That is, the temperature sensors 90 on the dummy substrate DP are also detachable with respect to the substrate stage PST.

The temperature sensor 90 has a plurality of sensor elements 91 provided on the surface of the dummy substrate DP. The sensor element 91 is constructed of, for example, a thermocouple.

A plurality of sensor arrangement areas SC, which correspond to the shot areas SA (see FIG. 6), are set on the dummy substrate DP. The sensor arrangement areas SC are designed to have approximately the same sizes (shapes) and the same arrangement as those of the shot areas SA to be exposed with the device pattern respectively. In this embodiment, three sensor arrangement areas SC in the X axis direction and the Y axis direction respectively (3×3), i.e., nine sensor arrangement areas SC in total are established substantially in a matrix form.

The plurality of sensor elements 91 are arranged for each of the sensor arrangement areas SC in a matrix form as viewed in a plan view respectively. In this embodiment, five sensor elements 91 in the X axis direction and the Y axis direction (5×5), i.e., twenty-five sensor elements 91 in total are provided in one sensor arrangement area SC respectively. That is, the temperature sensor 90 on the dummy substrate DP has the plurality of sensor elements 91 which are separated from each other at least in the non-scanning direction (Y axis direction) of the substrate P (dummy substrate DP).

A detecting section (probe) of the sensor element 91 of the temperature sensor 90 is exposed on the surface of the dummy substrate DP, which is capable of detecting the temperature of the liquid 1 in the liquid immersion area AR2. When the dummy substrate DP provided with the temperature sensors 90 is held by the substrate stage PST, the temperature sensors 90, which measure the temperature of the liquid 1 in the liquid immersion area AR2, can be arranged movably in the vicinity of the image plane of the projection optical system PL.

The sensor elements 91, which are arranged in the shot area SA including the projection area AR1 of the projection optical system PL, are arranged in the projection area AR1 of the projection optical system PL and the vicinity thereof. When the plurality of sensor elements 91 are arranged in the non-scanning direction (Y axis direction) in relation to the projection area AR1, it is possible to measure the temperature distribution at least in the non-scanning direction (Y axis direction) of the projection area AR1.

Signal transmission lines (cables) 93, which feed the temperature detection signals of the sensor elements 91 (temperature sensors 90) to the control unit CONT, are connected to the respective sensor arrangement areas SC. First ends of the signal transmission lines are connected to the sensor elements 91 (temperature sensors 90) of the respective sensor arrangement areas SC. Second ends of the signal transmission lines are connected to the control unit CONT disposed outside the dummy substrate DP (outside the substrate stage PST). The signal transmission lines 93 are embedded in the dummy substrate DP. The signal transmission lines 93, which are led out from the end of the dummy substrate DP, are connected to the control unit CONT.

The respective sensor arrangement areas SC, which are provided on the surface of the dummy substrate DP, are subjected to the surface treatment so that they have mutually different light reflectances. Specifically, the respective sensor arrangement areas SC are coated with material films which have mutually different light reflectances respectively. Accordingly, when the exposure light beam EL is radiated via the projection optical system PL and the liquid 1, the sensor elements 91 (temperature sensors 90), which are arranged in the respective sensor arrangement areas SC, can measure the temperature of the liquid 1 under mutually different light reflection conditions.

Alignment marks 94, which are formed to perform the positional adjustment of the sensor arrangement areas SC with respect to predetermined positions, are provided for the respective sensor arrangement areas SC on the dummy substrate DP. The alignment marks 94 are detected by an unillustrated alignment system. The alignment system determines the position information of the projection area AR1 of the projection optical system PL with respect to the temperature sensors 90 (sensor elements 91) arranged in the sensor arrangement areas SC on the basis of the results of the detection of the positions of the alignment marks 94. Subsequently, the alignment marks 94 are used to effect the positional adjustment between the projection area AR1 of the projection optical system PL and the sensor elements 91 of the respective sensor arrangement areas SC. Specifically, the process of positional adjustment is performed so that the sensor elements 91, which are aligned in the non-scanning direction (Y axis direction) and which are included in the sensor elements 91 arranged in the matrix form in the sensor arrangement area SC, are arranged in the projection area AR1 of the projection optical system PL, i.e., the direction of the alignment of the plurality of sensor elements 91 in the Y axis direction is coincident with the longitudinal direction of the projection area AR1 of the projection optical system PL.

Next, an explanation will be made about a procedure for measuring the temperature of the liquid 1 in the liquid immersion area AR2 with the temperature sensors 90 shown in FIG. 14. Before performing the liquid immersion exposure process for producing the device, the mask M is firstly loaded on the mask stage MST, and the dummy substrate DP provided with the temperature sensors 90 as described above is loaded on the substrate stage PST. Subsequently, the control unit CONT detects the positions of the alignment marks 94 as described above to determine the positional relationship between the projection area AR1 of the projection optical system PL and the temperature sensors 90 of the sensor arrangement areas SC so that the longitudinal direction (Y axis direction) of the projection area AR1 is coincident with the alignment direction of the sensor elements 91 in relation to the Y axis direction. Subsequently, the control unit CONT drives the liquid supply mechanism 50 and the liquid recovery mechanism 30 respectively to form the liquid immersion area AR2 between the projection optical system PL and the dummy substrate DP, and the mask M is irradiated with the exposure light beam EL. When the exposure light beam EL, which has passed through the mask M and the projection optical system PL, is radiated onto the liquid 1, the temperature distribution, which is caused by the illuminance distribution of the exposure light beam EL, arises in the liquid 1. The control unit CONT measures the temperature distribution of the liquid 1 in the liquid immersion area AR2 by using the temperature sensors 90 arranged on the substrate stage PST while performing the scanning movement in the X axis direction for the mask stage MST which supports the mask M and the substrate stage PST which supports the dummy substrate DP, in the same manner as in the operation to be performed when the device is produced. The temperature distribution of the shot area SA (projection area AR1) in the Y axis direction as well as the pattern distribution in the Y axis direction of the mask M is measured on the basis of the results of the detection of the respective sensor elements 91 aligned in the Y axis direction. On the other hand, the temperature distribution of the shot area SA in the X axis direction as well as the pattern distribution in the X axis direction of the mask M is measured on the basis of the respective results of the detection of the plurality of sensor elements 91 provided in the X axis direction in the sensor arrangement area SC to be subjected to the scanning movement in the X axis direction with respect to the projection area AR1. Accordingly, it is possible to measure the temperature distribution of the liquid 1 in the XY directions for one shot area SA.

In this procedure, the control unit CONT measures the temperature distribution for the plurality of sensor arrangement areas SC established on the dummy substrate DP respectively. The sensor arrangement areas SC are designed so that the light reflectances are different from each other respectively. Therefore, for example, when the substrate P, which has any different light reflectance (specifically any different type of photoresist), is used during the device production, it is possible to measure the liquid temperature distribution information under the light reflection direction corresponding to each of the substrates P.

The control unit CONT can execute various operations as described above so that the desired pattern image is projected onto the substrate P via the projection optical system PL and the liquid 1 on the basis of the temperature information (temperature distribution information) of the liquid 1 measured by using the temperature sensors 90 provided on the dummy substrate DP. For example, the correction amount is determined for correcting the driving operation of the image formation characteristic control unit 3, and the correction amount is determined for correcting the movement (posture) of the substrate stage PST during the scanning exposure. Further, the correction amount is determined for correcting the temperature of the liquid to be supplied from each of the supply ports 54a to 54f (53a to 53f) (see FIG. 10) so that the temperature of the liquid 1 in the liquid immersion area AR2 is uniform as in the second embodiment described above. The determined correction amounts are stored in the storage unit MRY.

The dummy substrate DP is unloaded from the substrate stage PST, and the substrate P for producing the device is loaded on the substrate stage PST during the period in which the control unit CONT performs the process for determining the correction amount as described above. Subsequently, the control unit CONT adjusts the temperature of the liquid 1 to be supplied for forming the liquid immersion area AR2 on the basis of the determined correction amount, adjusts the image characteristic of the projection optical system PL, and/or adjusts the movement (posture) of the substrate stage PST. Accordingly, the liquid immersion scanning exposure is performed for the substrate P while adjusting the positional relationship between the surface of the substrate P and the image plane formed via the projection optical system PL and the liquid 1.

Figure 15:
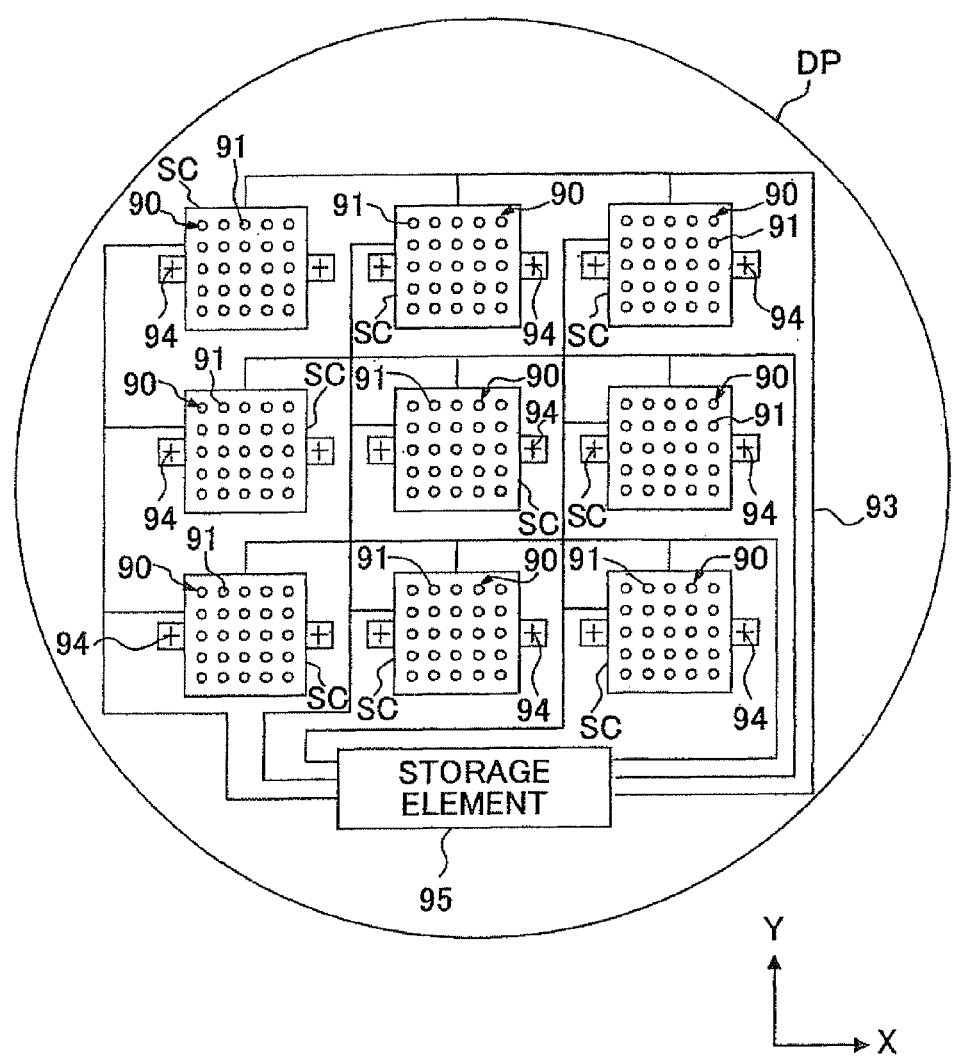
FIG. 15 shows a schematic arrangement illustrating a modified embodiment of FIG. 14.

FIG. 15 shows another embodiment of the dummy substrate DP provided with the temperature sensors 90. As shown in FIG. 15, a storage element 95, which stores the temperature detection signals of the temperature sensors 90, is provided for the dummy substrate DP. Specifically, the storage element 95 is embedded in the dummy substrate DP.

When the temperature of the liquid 1 of the liquid immersion area AR2 is detected by using the dummy substrate DP shown in FIG. 15, then the temperature of the liquid 1 of the liquid immersion area AR2 is detected in a state in which the dummy substrate DP is held by the substrate stage PST, and the result of the detection is stored in the storage element 95. Subsequently, after performing the test exposure, the dummy substrate DP is unloaded from the substrate stage PST, and the temperature detection result stored in the storage element 95 is extracted (read). When the liquid immersion exposure process is performed in order to produce the device, the control unit CONT determines the correction amount for adjusting the image characteristic of the projection optical system PL and/or determines the correction amount for adjusting the temperature of the liquid 1 to form the liquid immersion area AR2 on the basis of the extracted temperature information of the liquid in the same manner as in the embodiment described above. The storage element 95 may be provided detachably with respect to the dummy substrate DP. The storage element 95 may be detached from the dummy substrate DP after detecting the temperature of the liquid 1 to extract the result of the detection of the liquid temperature stored in the storage element 95.

As explained above, the liquid temperature can be measured while performing the scanning movement with respect to the exposure light beam EL by arranging the substrate having the temperature sensors 90 provided on the movable substrate stage PST. Therefore, it is possible to measure the liquid temperature distribution of the liquid immersion area AR2 corresponding to the shot area SA for producing the device. Owing to the construction that the temperature sensors 90 are provided on the dummy substrate DP having substantially the same shape as that of the substrate P for producing the device, the temperature can be measured in the state in which the liquid immersion area AR2 is satisfactorily formed between the projection optical system PL and the dummy substrate DP, i.e., under substantially the same condition as the liquid immersion exposure condition to be adopted during the production of the device. Further, the temperature of the liquid 1 can be accurately adjusted during the liquid immersion exposure on the basis of the result of the measurement.

As described above, the temperature distribution of the liquid immersion area AR2 is principally caused by the radiation of the exposure light beam EL. However, it is considered that the temperature distribution is also caused, for example, by the temperature environment around the exposure apparatus (around the liquid immersion area). In such a situation, when the temperature of the liquid is directly measured by the temperature sensors 90 as in this embodiment, the liquid temperature distribution of the liquid immersion area AR2 can be accurately measured even when the temperature environment around the exposure apparatus is varied.

In this embodiment, the temperature sensors 90 for detecting the temperature of the liquid 1 in the liquid immersion area AR2 are provided on the dummy substrate DP which is detachable with respect to the substrate stage PST. However, the temperature sensors 90 may be directly provided at predetermined positions of the substrate stage PST. Alternatively, the temperature sensors 90 may be provided detachably with respect to predetermined positions of the substrate stage PST. Further alternatively, the temperature sensors 90 may be provided movably in a predetermined area on the substrate stage PST. Further alternatively, a temperature sensor for detecting the liquid temperature of the liquid immersion area AR2 may be provided in the vicinity of the optical element 2 disposed at the end portion of the projection optical system PL. In the respective embodiments described above, the temperature of the liquid to be supplied from the respective supply ports is adjusted principally in order to adjust the projection state. However, the temperature of the liquid to be supplied from the respective supply ports may be adjusted for any other purpose. For example, the temperature of the liquid to be supplied from the respective supply ports can be adjusted so that the desired temperature distribution is obtained on the substrate P.

As described above, pure water is used as the liquid 1 in the foregoing embodiments. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiment of the present invention, the optical element 2 is attached to the end portion of the projection optical system PL. The lens can be used to adjust the optical characteristics of the projection optical system PL, including, for example, the aberration (for example, spherical aberration and comatic aberration). The optical element, which is attached to the end portion of the projection optical system PL, may be an optical plate usable to adjust the optical characteristic of the projection optical system PL. Alternatively, the optical element may be a plane parallel plate through which the exposure light beam EL is transmissive. When the optical element to make contact with the liquid 1 is the plane parallel plate which is cheaper than the lens, it is enough that the plane parallel plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid 1 is the lens. That is, the surface of the optical element to make contact with the liquid 1 is dirtied, for example, due to the adhesion of scattered particles generated from the resist by being irradiated with the exposure light beam EL or any adhered impurity contained in the liquid 1. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 1, is large between the substrate P and the optical element disposed at the end portion of the projection optical system PL, it is also allowable that the optical element is tightly fixed so that the optical element is not moved by the pressure, rather than allowing the optical element to be exchangeable.

The embodiment of the present invention is constructed such that the space between the projection optical system PL and the surface of the substrate P is filled with the liquid 1. However, for example, another arrangement may be adopted such that the space is filled with the liquid 1 in a state in which a cover glass constructed of a plane parallel plate is attached to the surface of the substrate P.

The liquid 1 is water in the embodiment of the present invention. However, the liquid 1 may be any liquid other than water. For example, when the light source of the exposure light beam EL is the $F_2$ laser, the $F_2$ laser beam is not transmitted through water. Therefore, in this case, those preferably usable as the liquid 1 may include, for example, a fluorine-based fluid such as fluorine-based oil through which the $F_2$ laser beam is transmissive. Alternatively, other than the above, it is also possible to use, as the liquid 1, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As for the type of the exposure apparatus EX, the present invention is not limited to the exposure apparatus for the semiconductor device production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 16:
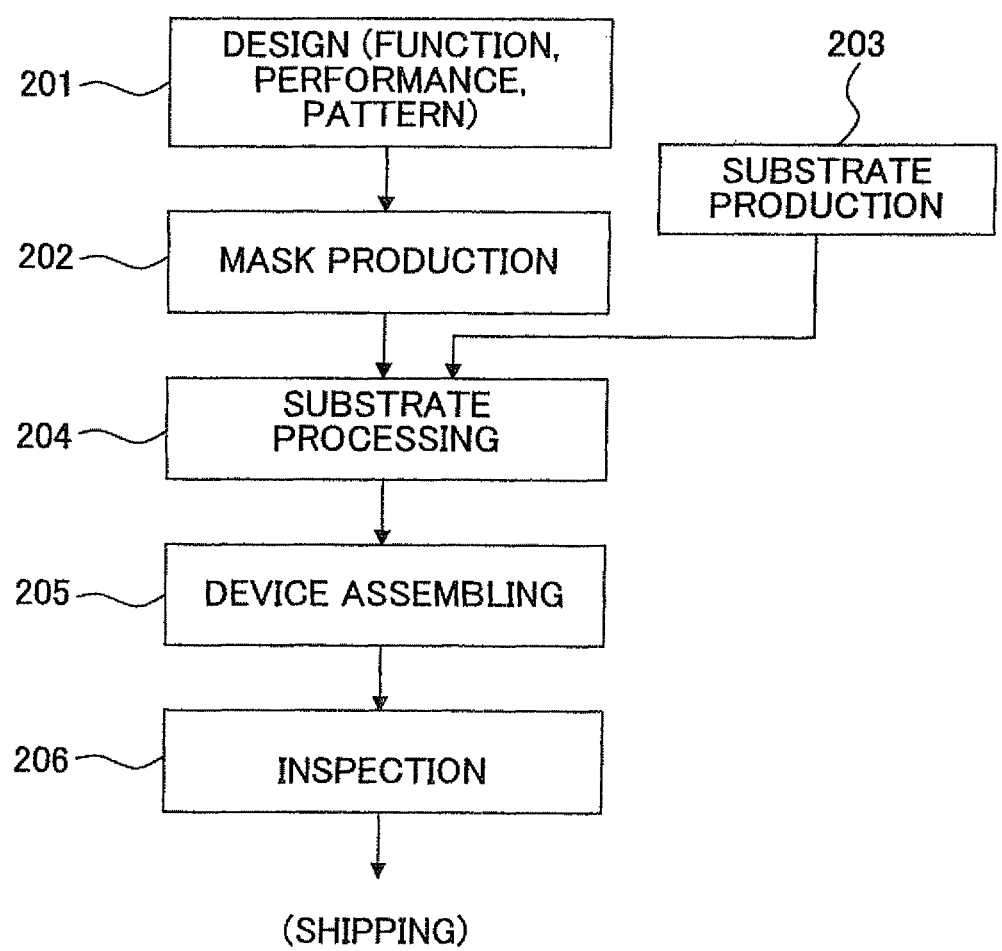
FIG. 16 shows a flow chart illustrating exemplary steps of producing a semiconductor device.

As shown in FIG. 16, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, even when the temperature distribution arises in the liquid for forming the liquid immersion area due to the distribution of the exposure light beam or the distribution of the pattern, the pattern can be transferred onto the substrate in the desired state by adjusting the projection state of the pattern image on the basis of the distribution of the exposure light beam or the distribution of the pattern. Accordingly, it is possible to produce the high performance device. Further, the temperature of the liquid for forming the liquid immersion area is directly measured by the temperature sensors arranged in the vicinity of the image plane of the projection optical system, and thus the liquid for forming the liquid immersion area can be adjusted to be in the desired temperature state on the basis of the result of the measurement. Therefore, the pattern can be transferred onto the substrate in the desired state.

What is claimed is:

1. An exposure apparatus which exposes a substrate by projecting an image of a pattern onto the substrate through a liquid, the exposure apparatus comprising:
   a projection optical system which has a plurality of optical elements, and which projects the image of the pattern onto the substrate;
   an imaging controller having a mover which moves a part of the plurality of optical elements;
   a stage system having a substrate stage on which the substrate is held, the substrate stage being movable below and relative to the projection optical system;
   a supply port via which the liquid is supplied to a space under the projection optical system;
   a recovery port which recovers the liquid supplied to the space;
   a temperature sensor which measures a temperature of the liquid recovered via the recovery port; and
   a controller which controls at least one of the imaging controller and the stage system, wherein
   a liquid immersion area smaller than an area of an upper surface of the substrate is formed locally in the space by supplying the liquid via the supply port and by recovering the liquid from the liquid immersion area via the recovery port, and
   the controller controls at least one of the imaging controller and the stage system based on a result of the measurement performed by the temperature sensor.

2. The exposure apparatus according to claim 1, further comprising a recovery tube which is connected to the recovery port and in which the temperature sensor is arranged.

3. The exposure apparatus according to claim 1, wherein a temperature of the liquid to be supplied from the supply port is adjusted based on the result of the measurement performed by the temperature sensor.

4. The exposure apparatus according to claim 1, wherein a supply amount of the liquid supplied from the supply port per a unit of time is adjusted based on the result of the measurement performed by the temperature sensor.

5. The exposure apparatus according to claim 1, wherein a projection state of the image is adjusted by controlling the imaging controller based on the result of the measurement performed by the temperature sensor.

6. The exposure apparatus according to claim 1, wherein a projection state of the image is adjusted by controlling the stage system based on the result of the measurement performed by the temperature sensor.

7. The exposure apparatus according to claim 1, wherein the recovery port includes a plurality of recovery ports which are arranged at positions different from each other, and the supplied liquid is recovered via the plurality of recovery ports, and the temperature sensor includes a plurality of sensors which are arranged corresponding to the plurality of recovery ports, respectively.

8. A control method used in an exposure apparatus which exposes a substrate by projecting an image of a pattern onto the substrate through a projection optical system and a liquid, the control method comprising:
holding the substrate on a substrate stage of a stage system, the substrate stage being movable below and relative to the projection optical system;
supplying the liquid to a space under the projection optical system via a supply port, the projection optical system having a plurality of optical elements, a part of the plurality of optical elements being moved by a mover of an imaging controller;
recovering the liquid supplied to the space via a recovery port;
measuring a temperature of the liquid recovered via the recovery port using a temperature sensor; and
controlling at least one of the imaging controller and the stage system based on a result of the measurement performed by the temperature sensor, wherein
a liquid immersion area smaller than an area of an upper surface of the substrate is formed locally in the space by supplying the liquid via the supply port and by recovering the liquid from the liquid immersion area via the recovery port.

9. The control method according to claim 8, wherein the temperature of the liquid is measured by arranging the temperature sensor in a recovery tube which is connected to the recovery port.

10. The control method according to claim 8, wherein a temperature of the liquid to be supplied from the supply port is adjusted based on the result of the measurement performed by the temperature sensor.

11. The control method according to claim 8, wherein a supply amount of the liquid supplied from the supply port per a unit of time is adjusted based on the result of the measurement performed by the temperature sensor.

12. The control method according to claim 8, wherein a projection state of the image is adjusted by controlling the imaging controller based on the result of the measurement performed by the temperature sensor.

13. The control method according to claim 8, wherein a projection state of the image is adjusted by controlling the stage system based on the result of the measurement performed by the temperature sensor.

14. The control method according to claim 8, wherein the recovery port includes a plurality of recovery ports which are arranged at positions different from each other, and the supplied liquid is recovered via the plurality of recovery ports, and the temperature sensor includes a plurality of sensors which are arranged corresponding to the plurality of recovery ports, respectively.

15. A device producing method comprising:
exposing a substrate using an exposure apparatus as defined in claim 1, the substrate being a base member of a device; and
assembling the device using the exposed substrate.

16. The exposure apparatus according to claim 1, wherein the recovery port is arranged such that the substrate to be exposed is positioned below the recovery port, and the substrate is moved relative to the recovery port when the image of the pattern is projected onto the substrate.

17. The exposure apparatus according to claim 1, wherein the exposure apparatus is configured to perform a scanning exposure, the recovery port includes a plurality of recovery ports which are arranged at positions different from each other, and the supplied liquid is recovered via the plurality of recovery ports, and the temperature sensor includes a plurality of sensors which are arranged corresponding to the plurality of recovery ports, respectively, the plurality of sensors being arranged in a direction perpendicular to a scanning direction of the scanning exposure.

18. The control method according to claim 8, wherein the recovery port is arranged such that the substrate to be exposed is positioned below the recovery port, and the substrate is moved relative to the recovery port when the image of the pattern is projected onto the substrate.

19. The control method according to claim 8, wherein the exposure apparatus is configured to perform a scanning exposure, the recovery port includes a plurality of recovery ports which are arranged at positions different from each other, and the supplied liquid is recovered via the plurality of recovery ports, and the temperature sensor includes a plurality of sensors which are arranged corresponding to the plurality of recovery ports, respectively, the plurality of sensors being arranged in a direction perpendicular to a scanning direction of the scanning exposure.

20. The exposure apparatus according to claim 1, wherein the temperature sensor is disposed between a recovery opening of the recovery port and a liquid recovery section that suctions the liquid from the space under the projection optical system through the recovery port.

21. The exposure apparatus according to claim 1, wherein projection of the image of the pattern onto the substrate is performed in parallel with the formation of the liquid immersion area and the measurement of the temperature of the liquid.

22. The control method according to claim 8, wherein the temperature sensor is disposed between a recovery opening of the recovery port and a liquid recovery section that suctions the liquid from the space under the projection optical system through the recovery port.

23. The control method according to claim 8, wherein projection of the image of the pattern onto the substrate is performed in parallel with the formation of the liquid immersion area and the measurement of the temperature of the liquid.

* * * * *